United States Patent
Ito et al.

(10) Patent No.: US 8,558,221 B2
(45) Date of Patent: Oct. 15, 2013

(54) POLYMERIC COMPOUND CONTAINING DOPANT AND HOST REPEATING UNITS AND ORGANIC ELECTROLUMINESCENCE ELEMENT

(75) Inventors: Mitsunori Ito, Chiba (JP); Yumiko Mizuki, Chiba (JP)

(73) Assignee: Idemitsu Kosan Co., Ltd., Tokyo (JP)

( * ) Notice: Subject to any disclaimer, the term of this patent is extended or adjusted under 35 U.S.C. 154(b) by 450 days.

(21) Appl. No.: 12/743,509

(22) PCT Filed: Nov. 18, 2008

(86) PCT No.: PCT/JP2008/070949
§ 371 (c)(1),
(2), (4) Date: Jul. 23, 2010

(87) PCT Pub. No.: WO2009/066666
PCT Pub. Date: May 28, 2009

(65) Prior Publication Data
US 2010/0289014 A1    Nov. 18, 2010

(30) Foreign Application Priority Data

Nov. 20, 2007 (JP) ................................. 2007-300088

(51) Int. Cl.
*H01L 29/08* (2006.01)
(52) U.S. Cl.
USPC ........................................... 257/40; 428/690
(58) Field of Classification Search
USPC ........................................... 428/690; 257/40
See application file for complete search history.

(56) References Cited

U.S. PATENT DOCUMENTS

| | | | |
|---|---|---|---|
| 5,759,444 A * | 6/1998 | Enokida et al. .......... 252/301.16 |
| 6,203,933 B1 * | 3/2001 | Nakaya et al. ................. 428/690 |
| 6,280,859 B1 * | 8/2001 | Onikubo et al. .............. 428/690 |
| 6,517,957 B1 * | 2/2003 | Senoo et al. .................... 428/690 |
| 6,743,948 B1 * | 6/2004 | Hosokawa et al. ........... 564/426 |
| 6,951,693 B2 * | 10/2005 | Hosokawa et al. ........... 428/690 |
| 7,405,326 B2 * | 7/2008 | Kawamura et al. ........... 564/427 |
| 7,651,746 B2 | 1/2010 | Hudack et al. |
| 7,763,761 B2 * | 7/2010 | Kubota et al. ................... 585/26 |
| 7,807,277 B2 * | 10/2010 | Negishi .......................... 428/690 |
| 7,981,523 B2 * | 7/2011 | Hosokawa et al. ........... 428/690 |
| 2003/0072966 A1 * | 4/2003 | Hosokawa et al. ........... 428/690 |
| 2003/0118866 A1 * | 6/2003 | Oh et al. ........................ 428/690 |
| 2004/0137270 A1 * | 7/2004 | Seo et al. ....................... 428/690 |
| 2005/0038296 A1 * | 2/2005 | Hosokawa et al. ........... 564/426 |
| 2005/0048318 A1 * | 3/2005 | Suzuki et al. ................. 428/690 |
| 2005/0064233 A1 * | 3/2005 | Matsuura et al. ............. 428/690 |
| 2005/0156164 A1 * | 7/2005 | Sotoyama ...................... 257/40 |
| 2005/0233165 A1 * | 10/2005 | Ido et al. ........................ 428/690 |
| 2005/0238910 A1 * | 10/2005 | Ionkin et al. .................. 428/690 |
| 2006/0058494 A1 | 3/2006 | Busing et al. |
| 2006/0110623 A1 * | 5/2006 | Funahashi et al. ............ 428/690 |
| 2006/0154107 A1 * | 7/2006 | Kubota et al. ................. 428/690 |
| 2007/0009760 A1 * | 1/2007 | Inoue et al. .................... 428/690 |
| 2007/0013296 A1 * | 1/2007 | Kubota et al. ................. 313/504 |
| 2007/0142671 A1 * | 6/2007 | Hosokawa et al. ........... 564/426 |
| 2007/0155991 A1 * | 7/2007 | Funahashi ...................... 564/426 |
| 2007/0196688 A1 * | 8/2007 | Ikeda et al. .................... 428/690 |
| 2008/0102312 A1 * | 5/2008 | Parham et al. ................. 428/704 |
| 2011/0034733 A1 * | 2/2011 | Funahashi et al. ............ 564/426 |
| 2011/0034744 A1 * | 2/2011 | Ikeda et al. ..................... 585/27 |
| 2011/0042660 A1 * | 2/2011 | Kawamura et al. ............ 257/40 |
| 2011/0175521 A1 * | 7/2011 | Hosokawa et al. ........... 313/504 |

FOREIGN PATENT DOCUMENTS

| | | |
|---|---|---|
| EP | 2 159 244 A1 | 3/2010 |
| JP | 2007 512249 | 5/2007 |
| JP | 2007 162009 | 6/2007 |
| WO | 2005 104263 | 11/2005 |
| WO | WO 2005104263 A1 * | 11/2005 ............. H01L 51/30 |

OTHER PUBLICATIONS

Extended European Search Report issued Oct. 7, 2011, in European Patent Application No. 08852465.7.

* cited by examiner

*Primary Examiner* — Anna Pagonakis
*Assistant Examiner* — Caleb Henry
(74) *Attorney, Agent, or Firm* — Oblon, Spivak, McClelland, Maier & Neustadt, L.L.P.

(57) ABSTRACT

A polymer comprising the repeating units derived from an aromatic compound having a specific structure and a repeating unit derived from the compound represented by formula (1):

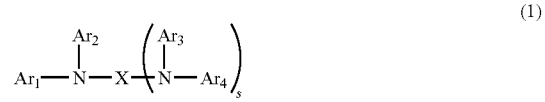

(1)

wherein $Ar_1$ to $Ar_4$ are each independently a substituted or unsubstituted aryl group having 6 to 40 ring-forming carbon atoms, a substituted or unsubstituted heterocyclic group having 3 to 40 ring-forming atoms, a substituted or unsubstituted alkyl group having 1 to 50 carbon atoms; X is a substituted or unsubstituted aryl group having 6 to 40 ring-forming carbon atoms, a substituted or unsubstituted heterocyclic group having 3 to 40 ring-forming atoms, or a substituted or unsubstituted di- to tetravalent styrene-derived group; and s is an integer of 0 to 3. The polymer is useful as a light emission material and realizes a polymer electroluminescence device excellent in device characteristics such as lifetime and emission efficiency.

20 Claims, No Drawings

POLYMERIC COMPOUND CONTAINING DOPANT AND HOST REPEATING UNITS AND ORGANIC ELECTROLUMINESCENCE ELEMENT

This application is a 371 of PCT/JP2008/070949 filed Nov. 18, 2008. Priority to Japanese patent application 2007-300088, filed Nov. 20, 2007, is claimed.

TECHNICAL FIELD

The present invention relates to a polymer comprising a repeating unit which function as dopant and a repeating unit which function as host and an organic electroluminescence device (organic EL device) employing the polymer.

BACKGROUND ART

Polymeric electroluminescence materials are widely studied because of their advantage that they are made into films by applying or printing their solutions. For example, polymers comprising an aromatic unit having a diarylamino group and a unit having a structure such as fluorene, dibenzofuran, and dibenzothiophene are reported (Patent Documents 1 and 2). However, a light emission device employing the above polymers is not necessarily sufficient in the device characteristics such as lifetime (half lifetime) and emission efficiency.

Patent Document 1: JP 2007-162009A
Patent Document 2: WO 2005/049546

DISCLOSURE OF THE INVENTION

An object of the invention is to provide a polymer which is useful as a light emission material and realizes a polymer EL device excellent in device characteristics such as lifetime and emission efficiency.

Thus, the present invention provide a polymer comprising a repeating unit A and a repeating unit B, wherein the repeating unit A is selected from divalent groups which are derived from compounds represented by formula (1):

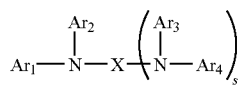

(1)

wherein $Ar_1$ to $Ar_4$ are each independently a substituted or unsubstituted aryl group having 6 to 40 ring-forming carbon atoms, a substituted or unsubstituted heterocyclic group having 3 to 40 ring-forming atoms, or a substituted or unsubstituted alkyl group having 1 to 50 carbon atoms; X is a substituted or unsubstituted aryl group having 6 to 40 ring-forming carbon atoms, a substituted or unsubstituted heterocyclic group having 3 to 40 ring-forming atoms, or a substituted or unsubstituted styrene-derived group; s is an integer of 0 to 3; two or three —$NAr_3Ar_4$ groups may be the same or different when s is 2 or 3; and —$NAr_3Ar_4$ is hydrogen atom when s is 0; and the repeating unit B is selected from divalent groups which are derived from compounds represented by any one of formulae (2) to (6):

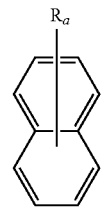
(2)

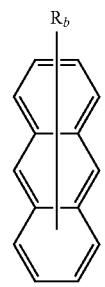
(3)

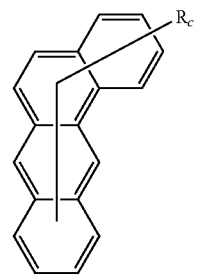
(4)

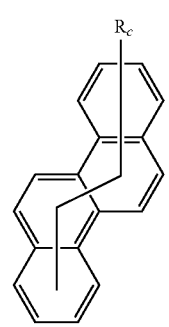
(5)

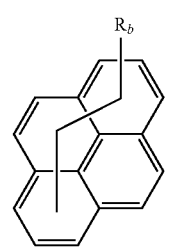
(6)

wherein R is a substituted or unsubstituted aryl group having 6 to 40 ring-forming carbon atoms, a substituted or unsubstituted heterocyclic group having 3 to 40 ring-forming atoms, or a substituted or unsubstituted alkyl group having 1 to 50 carbon atoms; a is an integer of 0 to 6; b is an integer of 0 to 8; and c is an integer of 0 to 10.

The present invention further provides an organic electroluminescence device comprising an anode, a cathode, and an organic compound layer which comprises a layer and is disposed between the anode and the cathode, wherein a layer of the organic compound layer is a light-emitting layer comprising the polymer mentioned above.

BEST MODE FOR CARRYING OUT THE INVENTION

The polymer of the invention comprises, as the repeating unit A, a divalent repeating unit derived from the compounds of formula (1):

(1)

In formula (1), $Ar_1$ to $Ar_4$ are each independently a substituted or unsubstituted aryl group having 6 to 40, preferably 6 to 20 ring-forming carbon atoms (nuclear carbon atoms), a substituted or unsubstituted heterocyclic group having 3 to 40, preferably 3 to 20 ring-forming atoms (nuclear atoms), or a substituted or unsubstituted alkyl group having 1 to 50, preferably 1 to 20, more preferably 1 to 5 carbon atoms (exclusive of carbon atom(s) of substituent(s)). X is a substituted or unsubstituted di- to tetravalent aryl group having 6 to 40, preferably 6 to 20 ring-forming carbon atoms (nuclear carbon atoms), a substituted or unsubstituted di- to tetravalent heterocyclic group having 3 to 40, preferably 3 to 20 ring-forming atoms (nuclear atoms), or a substituted or unsubstituted di- to tetravalent styrene-derived group. The subscript s is an integer of 0 to 3. When s is 2 or 3, two or three —$NAr_3Ar_4$ groups may be the same or different. When s is 0, —$NAr_3Ar_4$ is hydrogen atom.

Examples of the substituted or unsubstituted aryl group for $Ar_1$ to $Ar_4$ of formula (1) include phenyl group, 1-naphthyl group, 2-naphthyl group, 1-anthryl group, 2-anthryl group, 9-anthryl group, 1-phenanthryl group, 2-phenanthryl group, 3-phenanthryl group, 4-phenanthryl group, 9-phenanthryl group, 1-naphthacenyl group, 2-naphthacenyl group, 9-naphthacenyl group, 1-pyrenyl group, 2-pyrenyl group, 4-pyrenyl group, biphenyl-2-yl group, biphenyl-3-yl group, biphenyl-4-yl group, p-terphenyl-4-yl group, p-terphenyl-3-yl group, p-terphenyl-2-yl group, m-terphenyl-4-yl group, m-terphenyl-3-yl group, m-terphenyl-2-yl group, o-tolyl group, m-tolyl group, p-tolyl group, p-t-butylphenyl group, p-(2-phenylpropyl)phenyl group, 3-methyl-2-naphthyl group, 4-methyl-1-naphthyl group, 4-methyl-1-anthryl group, 4'-methylbiphenyl-4-yl group, and 4"-t-butyl-p-terphenyl-4-yl group.

Examples of the substituted or unsubstituted heterocyclic group for $Ar_1$ to $Ar_4$ of formula (1) include 1-pyrrolyl group, 2-pyrrolyl group, 3-pyrrolyl group, pyrazinyl group, 2-pyridinyl group, 3-pyridinyl group, 4-pyridinyl group, 1-indolyl group, 2-indolyl group, 3-indolyl group, 4-indolyl group, 5-indolyl group, 6-indolyl group, 7-indolyl group, 1-isoindolyl group, 2-isoindolyl group, 3-isoindolyl group, 4-isoindolyl group, 5-isoindolyl group, 6-isoindolyl group, 7-isoindolyl group, 2-furyl group, 3-furyl group, 2-benzofuranyl group, 3-benzofuranyl group, 4-benzofuranyl group, 5-benzofuranyl group, 6-benzofuranyl group, 7-benzofuranyl group, 1-isobenzofuranyl group, 3-isobenzofuranyl group, 4-isobenzofuranyl group, 5-isobenzofuranyl group, 6-isobenzofuranyl group, 7-isobenzofuranyl group, quinolyl group, 3-quinolyl group, 4-quinolyl group, 5-quinolyl group, 6-quinolyl group, 7-quinolyl group, 8-quinolyl group, 1-isoquinolyl group, 3-isoquinolyl group, 4-isoquinolyl group, 5-isoquinolyl group, 6-isoquinolyl group, 7-isoquinolyl group, 8-isoquinolyl group, 2-quinoxalinyl group, 5-quinoxalinyl group, 6-quinoxalinyl group, 1-carbazolyl group, 2-carbazolyl group, 3-carbazolyl group, 4-carbazolyl group, 9-carbazolyl group, 1-phenanthridinyl group, 2-phenanthridinyl group, 3-phenanthridinyl group, 4-phenanthridinyl group, 6-phenanthridinyl group, 7-phenanthridinyl group, 8-phenanthridinyl group, 9-phenanthridinyl group, 10-phenanthridinyl group, 1-acridinyl group, 2-acridinyl group, 3-acridinyl group, 4-acridinyl group, 9-acridinyl group, 1,7-phenanthrolin-2-yl group, 1,7-phenanthrolin-3-yl group, 1,7-phenanthrolin-4-yl group, 1,7-phenanthrolin-5-yl group, 1,7-phenanthrolin-6-yl group, 1,7-phenanthrolin-8-yl group, 1,7-phenanthrolin-9-yl group, 1,7-phenanthrolin-10-yl group, 1,8-phenanthrolin-2-yl group, 1,8-phenanthrolin-3-yl group, 1,8-phenanthrolin-4-yl group, 1,8-phenanthrolin-5-yl group, 1,8-phenanthrolin-6-yl group, 1,8-phenanthrolin-7-yl group, 1,8-phenanthrolin-9-yl group, 1,8-phenanthrolin-10-yl group, 1,9-phenanthrolin-2-yl group, 1,9-phenanthrolin-3-yl group, 1,9-phenanthrolin-4-yl group, 1,9-phenanthrolin-5-yl group, 1,9-phenanthrolin-6-yl group, 1,9-phenanthrolin-7-yl group, 1,9-phenanthrolin-8-yl group, 1,9-phenanthrolin-10-yl group, 1,10-phenanthrolin-2-yl group, 1,10-phenanthrolin-3-yl group, 1,10-phenanthrolin-4-yl group, 1,10-phenanthrolin-5-yl group, 2,9-phenanthrolin-1-yl group, 2,9-phenanthrolin-3-yl group, 2,9-phenanthrolin-4-yl group, 2,9-phenanthrolin-5-yl group, 2,9-phenanthrolin-6-yl group, 2,9-phenanthrolin-7-yl group, 2,9-phenanthrolin-8-yl group, 2,9-phenanthrolin-10-yl group, 2,8-phenanthrolin-1-yl group, 2,8-phenanthrolin-3-yl group, 2,8-phenanthrolin-4-yl group, 2,8-phenanthrolin-5-yl group, 2,8-phenanthrolin-6-yl group, 2,8-phenanthrolin-7-yl group, 2,8-phenanthrolin-9-yl group, 2,8-phenanthrolin-10-yl group, 2,7-phenanthrolin-1-yl group, 2,7-phenanthrolin-3-yl group, 2,7-phenanthrolin-4-yl group, 2,7-phenanthrolin-5-yl group, 2,7-phenanthrolin-6-yl group, 2,7-phenanthrolin-8-yl group, 2,7-phenanthrolin-9-yl group, 2,7-phenanthrolin-10-yl group, 1-phenazinyl group, 2-phenazinyl group, 1-phenothiazinyl group, 2-phenothiazinyl group, 3-phenothiazinyl group, 4-phenothiazinyl group, 10-phenothiazinyl group, 1-phenoxazinyl group, 2-phenoxazinyl group, 3-phenoxazinyl group, 4-phenoxazinyl group, 10-phenoxazinyl group, 2-oxazolyl group, 4-oxazolyl group, 5-oxazolyl group, 2-oxadiazolyl group, 5-oxadiazolyl group, 3-furazanyl group, 2-thienyl group, 3-thienyl group, 2-methylpyrrol-1-yl group, 2-methylpyrrol-3-yl group, 2-methylpyrrol-4-yl group, 2-methylpyrrol-5-yl group, 3-methylpyrrol-1-yl group, 3-methylpyrrol-2-yl group, 3-methylpyrrol-4-yl group, 3-methylpyrrol-5-yl group, 2-t-butylpyrrol-4-yl group, 3-(2-phenylpropyl)pyrrol-1-yl group, 2-methyl-1-indolyl group, 4-methyl-1-indolyl group, 2-methyl-3-indolyl group, 4-methyl-3-indolyl group, 2-t-butyl-1-indolyl group, 4-t-butyl-1-indolyl group, 2-t-butyl-3-indolyl group, and 4-t-butyl-3-indolyl group.

Examples of the substituted or unsubstituted alkyl group for $Ar_1$ to $Ar_4$ of formula (1) include methyl group, ethyl group, propyl group, isopropyl group, n-butyl group, s-butyl group, t-butyl group, pentyl group, hexyl group, heptyl group, octyl group, stearyl group, 2-phenylisopropyl group, trichloromethyl group, trifluoromethyl group, benzyl group, α-phenoxybenzyl group, α,α-dimethylbenzyl group, α,α-methylphenylbenzyl group, α,α-ditrifluoromethylbenzyl group, triphenylmethyl group, and α-benzyloxybenzyl group.

Examples of the substituted or unsubstituted aryl group for X of formula (1) include the di- to tetravalent groups which have the same skeletons as those of the substituted or unsubstituted aryl groups mentioned with respect to $Ar_1$ to $Ar_4$, with an aryl group derived from a condensed aromatic ring having 10 to 40 ring-forming carbon atoms, a group in which two or more condensed aromatic rings bond via single bonds, and a group in which the condensed aromatic ring and a non-condensed aromatic ring bond via single bond being particularly preferred. Examples of the condensed aromatic ring include naphthalene, phenanthrene, fluoranthene, anthracene, pyrene, perylene, coronene, chrysene, picene, dinaphthyl, trinaphthyl, phenylanthracene, diphenylanthracene, fluorene, triphenylene, rubicene, benzanthracene, dibenzanthracene, acenaphthofluoranthene, tribenzopentaphene, fluoranthenofluoranthene, benzodifluoranthene, benzofluoranthene, and diindenoperylene, with naphthalene, phenanthrene, fluoranthene, anthracene, pyrene, perylene, chrysene, phenylanthracene, and diphenylanthracene being particularly preferred.

Examples of the substituted or unsubstituted heterocyclic group for X of formula (1) include the di- to tetravalent groups which have the same skeletons as those of the substituted or unsubstituted heterocyclic groups mentioned with respect to $Ar_1$ to $Ar_4$.

Examples of the substituted or unsubstituted styrene-derived group for X of formula (1) include the di- to tetravalent groups which are derived from the compounds represented by formula (X1) mentioned below.

X is preferably a group derived from a compound represented by any one of formulae (X1) to (X11).

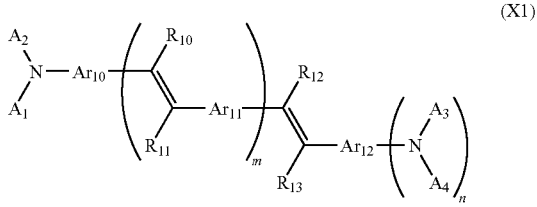

(X1)

In formula (X1), $Ar_{10}$ and $Ar_{11}$ are each independently a substituted or unsubstituted arylene group having 6 to 40 ring-forming carbon atoms or a substituted or unsubstituted divalent heterocyclic group having 3 to 40 ring-forming carbon atoms. $Ar_{11}$ is a substituted or unsubstituted di- to tetravalent (preferably divalent) aryl group having 6 to 40 ring-forming carbon atoms or a substituted or unsubstituted di- to tetravalent (preferably divalent) heterocyclic group having 3 to 40 ring-forming carbon atoms. $R_{10}$ to $R_{13}$ are each independently a hydrogen atom, a substituted or unsubstituted alkyl group having 1 to 50 carbon atoms (exclusive of carbon atom(s) of substituent(s)), a substituted or unsubstituted aryl group having 6 to 40 ring-forming carbon atoms, a substituted or unsubstituted aralkyl group having 7 to 50 carbon atoms (aryl moiety having 6 to 40 ring-forming carbon atoms), a substituted or unsubstituted cycloalkyl group having 3 to 50 ring-forming carbon atoms, a substituted or unsubstituted alkoxy group having 1 to 50 carbon atoms (exclusive of carbon atoms of substituent(s)), a substituted or unsubstituted aryloxy group having 6 to 40 ring-forming carbon atoms, amino group, a substituted or unsubstituted mono- or diarylamino group having an aryl group having 6 to 40 ring-forming carbon atoms, a substituted or unsubstituted mono- or dialkylamino group having an alkyl group having 1 to 20 carbon atoms (exclusive of carbon atom(s) of substituent(s)), cyano group, nitro group, hydroxyl group, or halogen atom (fluorine, chlorine, iodine, bromine). $A_1$ to $A_4$ are each independently a substituted or unsubstituted alkyl group having 1 to 50 carbon atoms (exclusive of carbon atom(s) of substituent(s)) or a substituted or unsubstituted aryl group having 6 to 40 ring-forming carbon atoms. The subscript m is an integer of 0 to 3, preferably 0 or 1; and n is an integer of 1 to 3, preferably 1. When n is an integer of 2 or more and $Ar_{12}$ includes two or more rings, two or more $—NA_3A_4$ groups may be bonded to different rings or the same ring.

Examples of the substituted or unsubstituted arylene group and the substituted or unsubstituted divalent heterocyclic group for $Ar_{10}$ and $Ar_{11}$ are selected from the divalent groups which are formed from the substituted or unsubstituted aryl groups and the substituted or unsubstituted heterocyclic groups mentioned with respect to $Ar_1$ to $Ar_4$ by removing one aromatic hydrogen atom or one hydrogen atom on the hetero ring.

Examples of the substituted or unsubstituted di- to tetravalent aryl group and the substituted or unsubstituted di- to tetravalent heterocyclic group for $Ar_{12}$ include the groups having the same skeletons as those of the substituted or unsubstituted aryl group and the substituted or unsubstituted heterocyclic group mentioned with respect to $Ar_1$ to $Ar_4$.

Examples of the substituted or unsubstituted alkyl group for $R_{10}$ to $R_{13}$ include methyl group, ethyl group, propyl group, isopropyl group, butyl group, s-butyl group, t-butyl group, pentyl group, hexyl group, heptyl group, octyl group, stearyl group, trichloromethyl group, and trifluoromethyl group.

Examples of the substituted or unsubstituted aryl group for $R_{10}$ to $R_{13}$ include phenyl group, 2-methylphenyl group, 3-methylphenyl group, 4-methylphenyl group, 4-ethylphenyl group, biphenyl group, 4-methylbiphenyl group, 4-ethylbiphenyl group, 4-cyclohexylbiphenyl group, terphenyl group, 3,5-dichlorophenyl group, naphthyl group, 5-methylnaphthyl group, anthryl group, and pyrenyl group.

Examples of the substituted or unsubstituted aralkyl group for $R_{10}$ to $R_{13}$ include benzyl group, 1-phenylethyl group, 2-phenylethyl group, 1-phenylisopropyl group, 2-phenylisopropyl group, phenyl-t-butyl group, α-naphthylmethyl group, 1-α-naphthylethyl group, 2-α-naphthylethyl group, 1-α-naphthylisopropyl group, 2-α-naphthylisopropyl group, β-naphthylmethyl group, 1-β-naphthylethyl group, 2-β-naphthylethyl group, 1-β-naphthylisopropyl group, 2-β-naphthylisopropyl group, 1-pyrrolylmethyl group, 2-(1-pyrrolyl)ethyl group, p-methylbenzyl group, m-methylbenzyl group, o-methylbenzyl group, p-chlorobenzyl group, m-chlorobenzyl group, o-chlorobenzyl group, p-bromobenzyl group, m-bromobenzyl group, o-bromobenzyl group, p-iodobenzyl group, m-iodobenzyl group, o-iodobenzyl group, p-hydroxybenzyl group, m-hydroxybenzyl group, o-hydroxybenzyl group, p-aminobenzyl group, m-aminobenzyl group, o-aminobenzyl group, p-nitrobenzyl group, m-nitrobenzyl group, o-nitrobenzyl group, p-cyanobenzyl group, m-cyanobenzyl group, o-cyanobenzyl group, α-phenoxybenzyl group, α,α-dimethylbenzyl group, α,α-methylphenylbenzyl group, α,α-ditrifluoromethylbenzyl group, triphenylmethyl group, α-benzyloxybenzyl group, 1-hydroxy-2-phenylisopropyl group, and 1-chloro-2-phenylisopropyl group.

Examples of the substituted or unsubstituted cycloalkyl group for $R_{10}$ to $R_{13}$ include cyclopropyl group, cyclobutyl group, cyclopentyl group, and cyclohexyl group.

Examples of the substituted or unsubstituted alkoxy group for $R_{10}$ to $R_{13}$ include methoxy group, ethoxy group, propoxy group, isopropoxy group, butoxy group, isobutoxy group, s-butoxy group, t-butoxy group, pentyloxy group (inclusive of isomers), and hexyloxy group (inclusive of isomers).

Examples of the substituted or unsubstituted aryloxy group for $R_{10}$ to $R_{13}$ include phenoxy group, tolyloxy group, and naphthyloxy group.

Example of the substituted or unsubstituted mono- or diarylamino group for $R_{10}$ to $R_{13}$ include mono- or diphenylamino group, mono- or ditolylamino group, mono- or dinaphthylamino group, and naphthylphenylamino group.

Examples of the substituted or unsubstituted mono- or dialkylamino group for $R_{10}$ to $R_{13}$ include mono- or dimethylamino group, mono- or diethylamino group, and mono- or dihexylamino group.

Examples of the substituted or unsubstituted alkyl group having 1 to 50 carbon atoms and substituted or unsubstituted aryl group having 6 to 40 ring-forming carbon atoms for $A_1$ to $A_4$ are selected from those mentioned with respect to $Ar_1$ to $Ar_4$.

When m and n are each an integer of 2 or more, $R_{10}$ groups, $R_{11}$ groups, $Ar_{11}$ groups, and —$NA_3A_4$ groups may be the same or different, respectively.

X which is derived from the compound of formula (X1) has 2 to 4 valences on the group selected from $Ar_{10}$, $Ar_{11}$ and $Ar_{12}$, and any one of $Ar_{10}$, $Ar_{11}$ and $Ar_{12}$ may have 2 or more valences. Examples of the compound of formula (X1) are described, for example, in WO 02/20459.

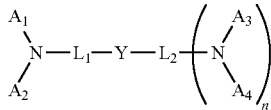
(X2)

In formula (X2), $A_1$, $A_2$, $A_3$, $A_4$, and n are as defined above, and Y is a non-condensed aryl group having 1 to 4 benzene rings. $L_1$ and $L_2$ are each independently a single bond or a substituted or unsubstituted arylene group having 6 to 20 ring-forming carbon atoms. Examples of the arylene group include the groups derived from benzene, biphenyl, terphenyl, naphthalene, and fluorene and further include the groups having a structure composed of these organic compounds which are linked via a single bond. Examples of Y include phenyl group, biphenylyl group, terphenyl group (inclusive of isomers), and quaterphenyl group (inclusive of isomers). When n is an integer of 2 or more and at the same time $L_2$ has 2 or more rings, 2 or more —$NA_3A_4$ groups may bond to different rings or the same ring (the same being applied to formulae (X3) to (X11)). The groups -$L_2$-($NA_3A_4$)$_n$ and -$L_1$-$NA_1A_2$ may bond to any benzene ring of Y and may bond to different benzene rings or the same benzene ring.

X which is derived from the compound of formula (X2) has 2 to 4 valences on the same benzene ring or different benzene rings of Y. The same benzene ring may have 2 or more valences. Examples of the compound of formula (X2) are described, for example, in JP 2006-140235A.

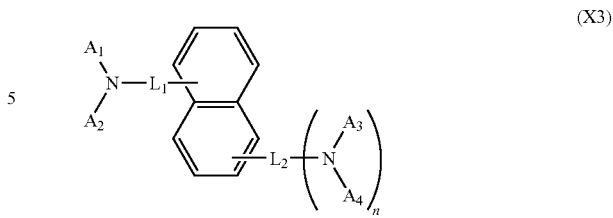
(X3)

In formula (X3), $A_1$, $A_2$, $A_3$, $A_4$, $L_1$, $L_2$, and n are as defined above. The groups -$L_2$-($NA_3A_4$)$_n$ and -$L_1$-$NA_1A_2$ may bond to any benzene ring of the naphthalene structure and may bond to different benzene rings or the same benzene ring.

X which is derived from the compound of formula (X3) has 2 to 4 valences on the benzene ring of the naphthalene structure and the same benzene ring may have 2 or more valences. Examples of the compound of formula (X3) are described, for example, in JP 2006-306745A.

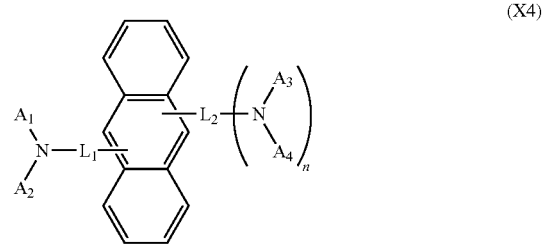
(X4)

In formula (X4), $A_1$, $A_2$, $A_3$, $A_4$, $L_1$, $L_2$, and n are as defined above. The groups -$L_2$-($NA_3A_4$)$_n$ and -$L_1$-$NA_1A_2$ may bond to any benzene ring of the anthracene structure and may bond to different benzene rings or the same benzene ring.

X which is derived from the compound of formula (X4) has 2 to 4 valences on the benzene ring of the anthracene structure. Each of three benzene rings may have at least one valence and the same benzene ring may have 2 or more valences. Examples of the compound of formula (X4) are described, for example, in WO 2004/09211.

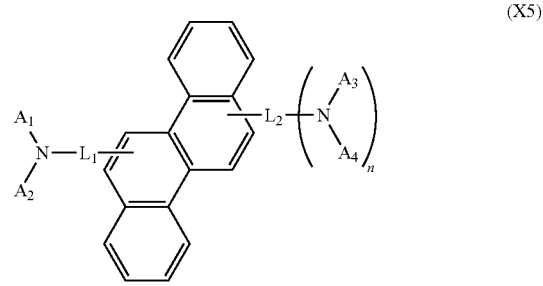
(X5)

In formula (X5), $A_1$, $A_2$, $A_3$, $A_4$, $L_1$, $L_2$, and n are as defined above. The groups -$L_2$-($NA_3A_4$)$_n$ and -$L_1$-$NA_1A_2$ may bond to any benzene ring of the chrysene structure and may bond to different benzene rings or the same benzene ring.

X which is derived from the compound of formula (X5) has 2 to 4 valences on the benzene ring of the chrysene structure. Each of four benzene rings may have one valence and the same benzene ring may have 2 or more valences. Examples of the compounds of formula (X5) are described, for example, in WO 2004/044088, JP 2006-256979A, and JP 2007-230960A.

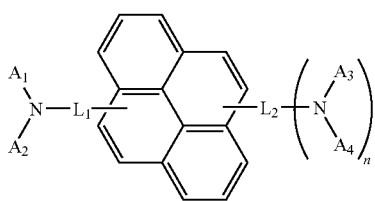
(X6)

In formula (X6), $A_1$, $A_2$, $A_3$, $A_4$, $L_1$, $L_2$, and n are as defined above. The groups -$L_2$-(N$A_3A_4$)$_n$ and -$L_1$-N$A_1A_2$ may bond to any benzene ring of the pyrene structure and may bond to different benzene rings or the same benzene ring.

X which is derived from the compound of formula (X6) has 2 to 4 valences on the benzene ring of the pyrene structure. Each of four benzene rings may have one valence and the same benzene ring may have 2 or more valences. Examples of the compound of formula (X6) are described, for example, in WO 2004/083162 and JP 2006-298793A.

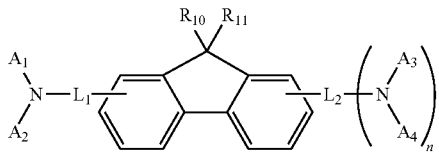
(X7)

In formula (X7), $R_{10}$, $R_{11}$, $A_1$, $A_2$, $A_3$, $A_4$, $L_1$, $L_2$, and n are the same as defined above. The groups -$L_2$-(N$A_3A_4$)$_n$ and -$L_1$-N$A_1A_2$ may bond to any of the benzene rings and may bond to different benzene rings or the same benzene ring.

X which is derived from the compound of formula (X7) has 2 to 4 valences on the benzene ring of the fluorene structure. Two benzene rings may have at least one valence, respectively. Alternatively, the same benzene ring may have 2 to 4 valences. Examples of the compound of formula (X7) are described, for example, in WO 02/20460.

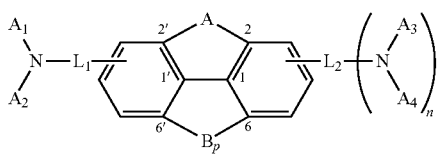
(X8)

In formula (X8), $A_1$, $A_2$, $A_3$, $A_4$, $L_1$, $L_2$, and n are as defined above. The groups -$L_2$-(N$A_3A_4$)$_n$ and -$L_1$-N$A_1A_2$ may bond to any benzene ring or may bond to different benzene rings or the same benzene ring.

In formula (X8), A is a substituted or unsubstituted divalent saturated group (substituent of A may have an unsaturated group) which forms a 5- to 8-membered ring together with the carbon atoms at 1, 2, 1', and 2' positions of the biphenyl structure. B is a substituted or unsubstituted divalent saturated group (substituent of B may have an unsaturated group) which forms a 5- to 8-membered ring together with the carbon atoms at 1, 6, 1', and 6' positions of the biphenyl structure. A and B may be the same or different. The subscript p is 0 or 1. When p is 0, no bond is formed between the carbon atoms at 6 and 6' positions. The ring structure formed by a substituted A and the carbon atoms at 1, 2, 1', and 2' positions and/or the ring structure formed by a substituted B and the carbon atoms at 1, 6, 1', and 6' positions may have a spiro-ring structure. The atoms for forming A or B may include C, Si, O, S, N, B, P, and combination thereof. Examples of A and B are described below, although not limited thereto.

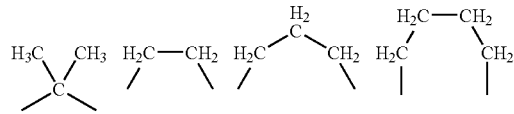

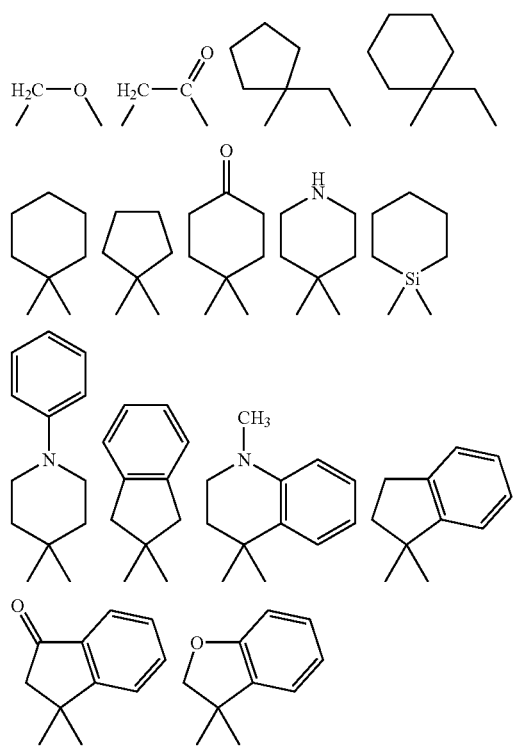

X which is derived from the compound of formula (X8) has 2 to 4 valences on the benzene ring of the biphenyl structure. Two benzene rings may have at least one valence, respectively. Alternatively, the same benzene ring may have 2 to 4 valences. Examples of the compound of formula (X8) are described, for example, in WO 02/20460.

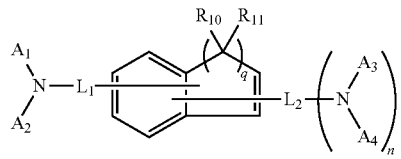
(X9)

In formula (X9), $R_{10}$, $R_{11}$, $A_1$, $A_2$, $A_3$, $A_4$, $L_1$, $L_2$, and n are as defined above and q is an integer of 1 to 3. The groups -$L_2$-(N$A_3A_4$)$_n$ and -$L_1$-N$A_1A_2$ may bond to any of the benzene ring and the 5-membered ring (if q is 1) and may bond to different rings or the same ring.

X which is derived from the compound of formula (X9) has 2 to 4 valences on the benzene ring and/or the 5-membered ring (if q is 1). Examples of the compound of formula (X9) are described, for example, in JP 2007-137824A.

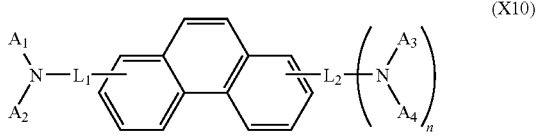
(X10)

In formula (X10), $A_1$, $A_2$, $A_3$, $A_4$, $L_1$, $L_2$, and n are as defined above. The groups -$L_2$-(N$A_3A_4$)$_n$ and -$L_1$-N$A_1A_2$ may bond to any benzene ring of the phenanthrene structure and may bond to different benzene rings or may bond to the same benzene ring.

X which is derived from the compound of formula (X10) has 2 to 4 valences on the benzene ring of the phenanthrene structure. Each of three benzene rings may have at least one valence or the same benzene ring may have 2 or more valences. Examples of the compound of formula (X10) are described, for example, in JP 2007-45725A.

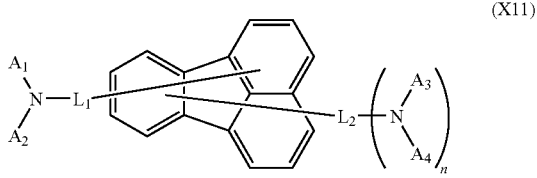
(X11)

In formula (X11), $A_1$, $A_2$, $A_3$, $A_4$, $L_1$, $L_2$, and n are as defined above. The groups -$L_2$-(N$A_3A_4$)$_n$ and -$L_1$-N$A_1A_2$ may bond to any benzene ring of the fluoranthene structure and may bond to different benzene rings or the same benzene ring.

X which is derived from the compound of formula (X11) has 2 to 4 valences on the benzene ring of the fluoranthene structure. Each of three benzene rings may have at least one valence or the same benzene ring may have 2 or more valences. Examples of the compound of formula (X11) are described, for example, in JP 2005-068087A.

The repeating unit A derived from the compound of formula (1) is preferably represented by formulae (1a) to (1e):

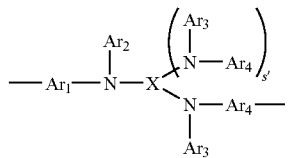
(1a)

(ab)

(1c)

(1d)

(1e)

wherein $Ar_1$ to $Ar_4$, X and s are as defined above, and s' is an integer of 0 to 2.

Examples of the compound of formula (1) which forms the repeating unit A include the compounds which are obtainable by replacing P of the compound described in JP 2006-140235A with the divalent group derived from the compound of formulae (X1) to (X11), although not limited thereto.

In addition to the repeating unit A, the polymer of the invention further comprises a divalent repeating unit (repeating unit B) derived from the compounds represented by formulae (2) to (6):

(2)

(3)

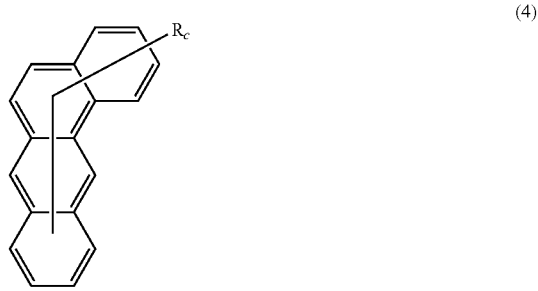
(4)

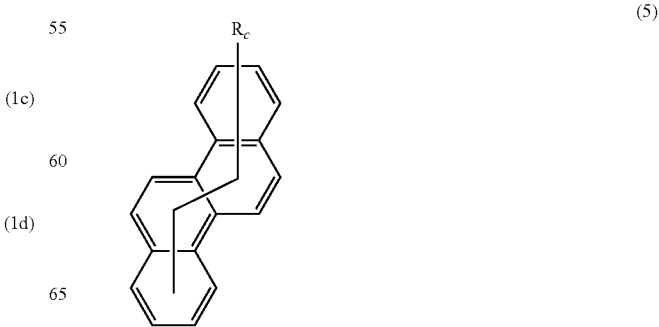
(5)

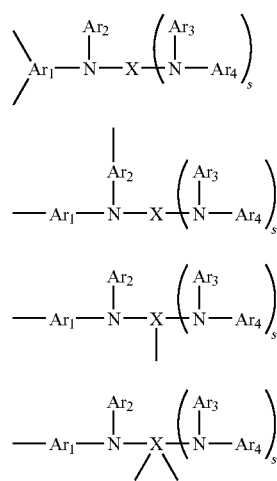

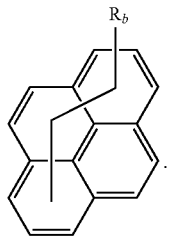

In formulae (2) to (6), R is a substituted or unsubstituted aryl group having 6 to 40 ring-forming carbon atoms, a substituted or unsubstituted heterocyclic group having 3 to 40 ring-forming atoms or a substituted or unsubstituted alkyl group having 1 to 50 carbon atoms; a is an integer of 0 to 6; b is an integer of 0 to 8; and c is an integer of 0 to 10. The aryl group, heterocyclic group and alkyl group are respectively selected from the substituted or unsubstituted aryl group, substituted or unsubstituted heterocyclic group and substituted or unsubstituted alkyl group which are mentioned with respect to $Ar_1$ to $Ar_4$. In formulae (2) to (6), R may bond to any benzene ring and 2 or more R groups may bond to the same benzene ring.

Preferred compounds of formula (3) are

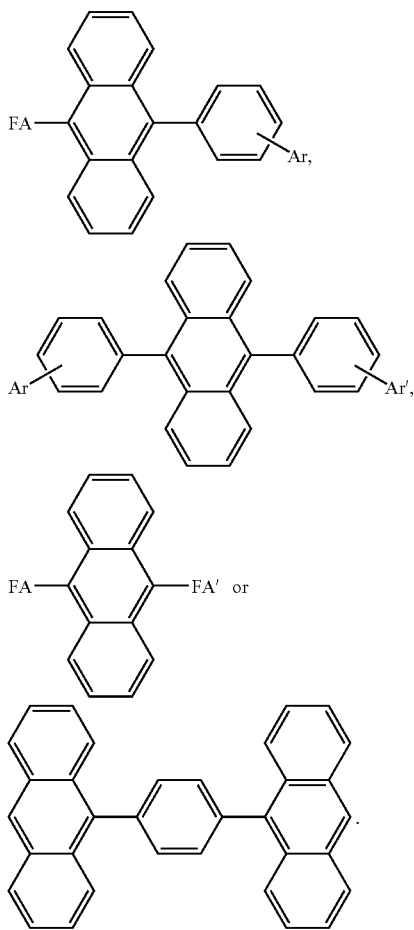

In the above formulae, Ar and Ar' are each independently a substituted or unsubstituted aryl group having 6 to 40 ring-forming carbon atoms, a substituted or unsubstituted heterocyclic group having 3 to 40 ring-forming atoms, or a substituted or unsubstituted alkyl group having 1 to 50 carbon atoms. These groups are respectively selected from the substituted or unsubstituted aryl group, substituted or unsubstituted heterocyclic group and substituted or unsubstituted alkyl group which are mentioned with respect to $Ar_1$ to $Ar_4$. FA and FA' are each independently a substituted or unsubstituted aryl group having 6 to 30 ring-forming carbon atoms and selected from the substituted or unsubstituted aryl group which is mentioned with respect to $Ar_1$ to $Ar_4$.

The repeating unit B derived from formulae (2) to (6) has its 2 valences on any benzene ring of formulae (2) to (6). Two valences may be positioned on different benzene rings or the same benzene ring.

Examples of the compound of formulae (2) to (6) are described, for example, in JP 2002-243545A, JP 2003-401038A, JP 2003-423317A, WO 01/172673, and WO 2007/004364.

The polymer of the invention including the repeating units A and the repeating units B may be random copolymer (-AB-BABBBAAABA-), alternating copolymer (-ABABABABA-BAB-), block copolymer (-AAAAAABBBBBB-), and graft copolymer comprising the side chain of repeating units A and the main chain of repeating units B, and vice versa.

The number average molecular weight (Mn) of the polymer is preferably $10^3$ to $10^8$, and more preferably $10^4$ to $10^6$. The weight average molecular weight (Mw) thereof is preferably $10^3$ to $10^8$, and more preferably $10^5$ to $10^6$. Both molecular weights were determined by size exclusion chromatography (SEC) using standard polystyrene calibration.

The molar ratio of the repeating units A and the repeating units B is preferably 0.1:99.9 to 99.9:0.1, more preferably 0.1 to 50, still more preferably 0.1 to 40, and particularly preferably 1 to 40.

The polymer of the invention is produced, for example, by the polycondensation of a compound represented by formula (9):

$$Y^1\text{-(repeating unit A)-}Y^2 \qquad (9)$$

and a compound represented by formula (10)

$$Y^1\text{-(repeating unit B)-}Y^2 \qquad (10).$$

In formulae (9) and (10), $Y^1$ and $Y^2$ are each independently a halogen atom (chlorine atom, bromine atom, iodine atom), a sulfonate group ($-OSO_2R^1$, wherein $R^1$ is a group selected from the substituted or unsubstituted aryl group and the substituted or unsubstituted alkyl group which are mentioned with respect to $Ar_1$ to $Ar_4$), methoxy group, a boric ester group, a borate group ($-B(OH)_2$), $-MgX^1$ ($X^1$ is halogen atom such as chlorine atom, bromine atom, and iodine atom), $-ZnX^1$ ($X^1$ is as defined above), $-SnR^1$ ($R^1$ is as defined above), with halogen atom, boric ester group and borate group being preferred.

The boric ester group may include the following groups:

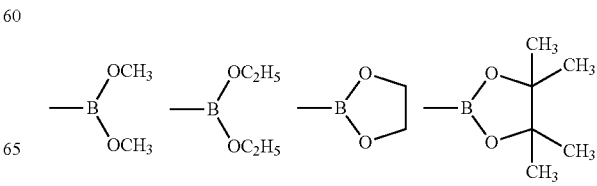

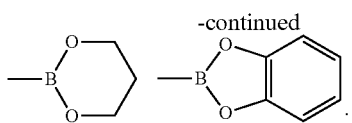

Examples of the optional substituent for "a substituted or unsubstituted . . . group" mentioned above include alkyl group having 1 to 20 carbon atoms, cycloalkyl group having 3 to 10 carbon atoms, aryl group having 6 to 30 ring-forming carbon atoms, alkoxy group having 1 to 20 carbon atoms, cycloalkoxy group having 3 to 10 carbon atoms, aryloxy group having 6 to 30 ring-forming carbon atoms, aralkyl group having 7 to 31 carbon atoms (aryl moiety has 6 to 30 ring-forming carbon atoms), heterocyclic group having 3 to 30 ring-forming carbon atoms, mono- or dialkylamino group having alkyl group having 1 to 20 carbon atoms, mono- or diarylamino group having aryl group having 6 to 30 ring-forming carbon atoms, halogen atom, nitro group, cyano group, and hydroxyl group.

The polycondensation is conducted, if necessary, in the presence of a catalyst and a base. Examples of the catalyst include a transition metal complex such as a palladium complex, for example, palladium [tetrakis(triphenylphosphine)], [tris(dibenzylideneacetone)]dipalladium, and palladium acetate, and a nickel complex, for example, nickel [tetrakis(triphenylphosphine)], [1,3-bis(diphenylphosphino)propane]dichloronickel, and [bis(1,4-cyclooctadiene)]nickel; and a catalyst having a ligand such as triphenylphosphine, tri(t-butylphosphine), tricyclohexylphosphine, diphenylphosphinopropane, and bipyridyl. These catalysts may be used alone or in combination of two or more. The catalyst is used preferably 0.001 to 300 mol % and more preferably 0.01 to 20 mol % based on the total molar amount of the compounds of formulae (9) and (10).

Examples of the base include inorganic base such as sodium carbonate, potassium carbonate, cesium carbonate, potassium fluoride, cesium fluoride, and tripotassium phosphate; and organic base such as tetrabutylammonium fluoride, tetrabutylammonium chloride, tetrabutylammonium bromide, and tetrabutylammonium hydroxide. The base is used preferably 0.5 to 20 equivalents and more preferably 1 to 10 equivalents based on the total molar amount of the compounds of formulae (9) and (10).

The polycondensation may be conducted in the presence of an organic solvent. Examples of the organic solvent include toluene, xylene, mesitylene, tetrahydrofuran, 1,4-dioxane, dimethoxyethane, N,N-dimethylacetamide, and N,N-dimethylformamide. These organic solvents may be used alone or in combination of two or more. The organic solvent is used in an amount such that the concentration of the monomers (compounds of formulae (9) and (10)) is preferably 0.1 to 90% by weight and more preferably 1 to 50% by weight.

The temperature of polycondensation is not particularly limited as long as the reaction medium is kept in liquid state, and preferably −100 to 200° C. and more preferably 0 to 120° C. The polycondensation time varies depending upon the reaction conditions, and preferably one hour or more, more preferably 2 to 500 h.

The aimed polymer is separated from the polycondensation product by a known method, for example, by adding the reaction product solution into a lower alcohol such as methanol, collecting the precipitates by filtration and drying the collected precipitates. If the purity is low, the polymer may be purified by a known method such as recrystallization, Soxhlet continuous extraction and column chromatography.

In the organic EL device of the invention, an organic compound layer comprising a layer is interposed between a pair of electrodes. At least one layer of the organic compound layer is a light-emitting layer. The thickness of the light-emitting layer is preferably 5 to 200 nm and more preferably 10 to 40 nm in view of a low driving voltage. The polymer of the invention is comprised in a layer of the organic compound layer, preferably in the light-emitting layer. It is preferred to dispose intermediate layers of various types between the organic compound layer and each electrode. Examples of the intermediate layer include a hole injecting layer, a hole transporting layer, an electron injecting layer, and an electron transporting layer. These layers are formed from a known organic and inorganic compound. Examples of the typical architecture of the organic EL devices, but not particularly limited to, include (1) anode/light-emitting layer/cathode,
(2) anode/hole injecting layer/light-emitting layer/cathode,
(3) anode/light-emitting layer/electron injecting layer/cathode,
(4) anode/hole injecting layer/light-emitting layer/electron injecting layer/cathode,
(5) anode/organic semiconductor layer/light-emitting layer/cathode,
(6) anode/organic semiconductor layer/electron blocking layer/light-emitting layer/cathode,
(7) anode/organic semiconductor layer/light-emitting layer/adhesion improving layer/cathode,
(8) anode/hole injecting layer/hole transporting layer/light-emitting layer/electron injecting layer/cathode,
(9) anode/insulating layer/light-emitting layer/insulating layer/cathode,
(10) anode/inorganic semiconductor layer/insulating layer/light-emitting layer/insulating layer/cathode,
(11) anode/organic semiconductor layer/insulating layer/light-emitting layer/insulating layer/cathode,
(12) anode/insulating layer/hole injecting layer/hole transporting layer/light-emitting layer/insulating layer/cathode, and
(13) anode/insulating layer/hole injecting layer/hole transporting layer/light-emitting layer/electron injecting layer/cathode, with the device structure (8) being preferably used.

The organic EL device is formed generally on a light-transmissive substrate. The light-transmissive substrate serves as a support for the organic EL device. A flat and smooth substrate having a transmittance of 50% or more to 400 to 700 nm visible lights is preferably used. A glass plate and a synthetic resin plate are preferably used as the light-transmissive substrate. Examples of the glass plate include those made from soda-lime glass, barium-strontium-containing glass, lead glass, aluminosilicate glass, borosilicate glass, barium borosilicate glass, or quartz. Examples of the synthetic resin plate include those made from polycarbonate resin, acrylic resin, polyethylene terephthalate resin, polyether sulfide resin or polysulfone resin.

The anode is preferably made from an electrode material having a large work function (4 eV or more), for example, a metal, an alloy, an electron-conductive compound and mixtures thereof. Examples of the electrode material for anode include a metal such as Au and an electron-conductive material such as CuI, ITO (indium tin oxide), $SnO_2$, ZnO, and In—Zn—O. The anode is formed by depositing the electrode material into a thin film by a vapor deposition method and a sputtering method. When allowing the emitted light from the light-emitting layer to pass through the anode, the transmittance of the anode to the emitted light is preferably 10% or more. The sheet resistance of the anode is preferably several hundreds Ω/square or less. The thickness of the anode varies depending upon the kind of material and generally 10 nm to 1 μm preferably 50 to 200 nm.

The cathode is made from an electrode material having a small work function (4 eV or less), for example, an alloy, an electron-conductive compound and mixtures thereof. Examples of the electrode material for cathode include sodium, sodium-potassium alloy, magnesium, lithium, magnesium silver alloy, aluminum/aluminum oxide, $Al/Li_2O$, $Al/LiO_2$, Al/LIF, aluminum lithium alloy, indium, and rare earth metal. The cathode is formed by depositing the electrode material into a thin film by a vapor deposition method and a sputtering method. When allowing the emitted light from the organic compound layer to pass through the cathode, the transmittance of the cathode to the emitted light is preferably 10% or more. The sheet resistance of the cathode is preferably several hundreds Ω/square or less. The thickness of the cathode is generally 10 nm to 1 μm and preferably 50 to 200 nm.

In the organic EL device of the invention, it is preferred to dispose at least one layer selected from a chalcogenide layer, a metal halide layer and a metal oxide layer (hereinafter may be referred to as "surface layer") on the surface of at least one of the pair of electrodes. For example, a layer of chalcogenide (inclusive of oxide) of metal such as silicon and aluminum is disposed on the surface of anode which faces the organic compound layer, and a metal halide layer or a metal oxide layer is disposed on the surface of cathode which faces the organic compound layer. With such a surface layer, the organic EL device is driven stably. Preferred examples of the chalcogenide include $SiOx$ ($1 \leq x \leq 2$), $AlOx$ ($1 \leq x \leq 1.5$), SiON, and SiAlON; preferred examples of the metal halide include LIF, $MgF_2$, $CaF_2$, and rare earth metal fluoride; and preferred examples of the metal oxide include $Cs_2O$, $Li_2O$, MgO, SrO, BaO, and CaO.

In the organic EL device of the invention, it is also preferable to dispose a mixed region of an electron transferring compound and a reductive dopant or a mixed region of a hole transferring compound and an oxidative dopant on the surface of at least one of the pair of electrodes. With such a mixed region, the electron transporting compound is reduced into anions to facilitate the injection and transfer of electrons into the emission medium from the mixed region. Alternatively, the hole transferring compound is oxidized to cations to facilitate the injection and transfer of holes into the emission medium from the mixed region. Preferred examples of the oxidative dopant include Lewis acids and acceptor compounds. Preferred examples of the reductive dopant include alkali metals, alkali metal compounds, alkaline earth metals, rare earth metals and compounds thereof.

In the organic EL device of the invention, the light-emitting layer has the following functions:
(i) Injection function: function of injecting holes from the anode or hole injecting layer, and injecting electrons from the cathode or electron injecting layer, due to the action of electric field;
(ii) Transporting function: function of transporting the injected charges (holes and electrons) by the force of electric field; and
(iii) Emission function: function of providing a zone for recombination of electrons and holes to cause the emission.

The layer (the organic compound layer, particularly the light-emitting layer) containing the polymer of the invention is formed, for example, by making a solution of the polymer into a film. Examples of the film-forming method include a spin coating method, a casting method, a microgravure coating method, a gravure coating method, a bar coating method, a roll coating method, a wire bar coating method, a dip coating method, a spray coating method, a screen printing method, a flexographic printing method, an off-set printing method, and an ink-jet printing method, with the screen printing method, flexographic printing method, off-set printing method, and ink-jet printing method being preferred because of their easiness of pattern formation. Since the film formation by these methods can be made under the conditions well known by a skilled person, the details thereof are omitted here for conciseness.

It is sufficient for the film-forming solution to contain a kind of the polymer of the invention. In addition to the polymer, the film-forming solution may contain a hole transporting material, an electron transporting material, a light-emitting material, a solvent, and an additive such as a stabilizer. The content of the polymer in the film-forming solution is preferably 20 to 100% by weight and more preferably 40 to 100% by weight based on the total amount of the dissolved components other than the solvent. The amount of the solvent is preferably 1 to 99.9% by weight and more preferably 80 to 99% by weight based on the film-forming solution.

The film-forming solution may contain an additive for controlling the viscosity and/or surface tension, for example, a thickener (polymers, poor solvents of the polymer of the invention, etc.), a viscosity depressant (low molecular compounds, etc.) and a surfactant. In addition, an antioxidant not adversely affecting the performance of the organic EL device, for example, a phenol antioxidant and a phosphine antioxidant, may be included so as to improve the storage stability.

Examples of the solvent for the film-forming solution include a chlorine-containing solvent such as chloroform, methylene chloride, 1,2-dichloroethane, 1,1,2-trichloroethane, chlorobenzene, and o-dichlorobenzene; an ether solvent such as tetrahydrofuran, dioxane, and anisole; an aromatic hydrocarbon solvent such as toluene and xylene; an aliphatic hydrocarbon solvent such as cyclohexane, methylcyclohexane, n-pentane, n-hexane, n-heptane, n-octane, n-nonane, and n-decane; a ketone solvent such as acetone, methyl ethyl ketone, cyclohexanone, benzophenone, and acetophenone; an ester solvent such as ethyl acetate, butyl acetate, ethyl cellosolve acetate, methyl benzoate, and phenyl acetate; a polyhydric alcohol and its derivatives such as ethylene glycol, ethylene glycol monobutyl ether, ethylene glycol monoethyl ether, ethylene glycol monomethyl ether, dimethoxyethane, propylene glycol, diethoxymethane, triethylene glycol monoethyl ether, glycerin, and 1,2-hexanediol; an alcoholic solvent such as methanol, ethanol, propanol, isopropanol, and cyclohexanol; a sulfoxide solvent such as dimethyl sulfoxide; and an amide solvent such as N-methyl-2-pyrrolidone and N,N-dimethylformamide. These organic solvents may be used alone or in combination of two or more. Of the above solvents, in view of solubility, uniform film formation, viscosity, etc., preferred are the aromatic hydrocarbon solvent, the ether solvent, the aliphatic hydrocarbon solvent, the ester solvent and the ketone solvent, and more preferred are toluene, xylene, ethylbenzene, diethylbenzene, trimethylbenzene, n-propylbenzene, isopropylbenzene, n-butylbenzene, isobutylbenzene, 5-butylbenzene, n-hexylbenzene, cyclohexylbenzene, 1-methylnaphthalene, tetralin, anisole, ethoxybenzene, cyclohexane, bicyclohexyl, cyclohexenylcyclohexanone, n-heptylcyclohexane, n-hexylcyclohexane, decalin, methyl benzoate, cyclohexanone, 2-propylcyclohexanone, 2-heptanone, 3-heptanone, 4-heptanone, 2-octanone, 2-nonanone, 2-decanone, dicyclohexyl ketone, acetophenone, and benzophenone.

The light-emitting layer may contain an organic compound other than the polymer, and another light-emitting layer containing a known organic compound may be laminated onto the light-emitting layer containing the polymer, if necessary, as long as the object of the invention is not adversely affected.

For example, the light-emitting layer may contain, in addition to the polymer, a compound selected from a compound represented by formula (1), a homopolymer composed of the repeating units A, a copolymer having the repeating units A, a compound represented by any of formulae (2) to (6), a homopolymer composed of the repeating units B, and a copolymer having the repeating units B.

The light-emitting layer may contain a known fluorescent or phosphorescent dopant in an amount of 0.1 to 20 parts by weight per 100 parts by weight of the polymer, because the luminance and the emission efficiency are further improved. The fluorescent dopant may be selected from amine compound, chelate complex such as tris(8-quinolinolato)aluminum, coumarin derivative, tetraphenylbutadiene derivative, and oxadiazole derivative according to the desired emission color. The phosphorescent dopant is preferably a metal complex comprising a metal selected from Ir, Ru, Pd, Pt, Os and Re, and the ligand thereof has preferably a skeletal structure selected from phenylpyridine, bipyridyl and phenanthroline. Examples of the metal complex include tris(2-phenylpyridine)iridium, tris(2-phenylpyridine)ruthenium, tris(2-phenylpyridine)palladium, bis(2-phenylpyridine)platinum, tris(2-phenylpyridine)osmium, tris(2-phenylpyridine)rhenium, octaethylplatinum porphyrin, octaphenylplatinum porphyrin, octaethylpalladium porphyrin, and octaphenylpalladium porphyrin. The metal complex is not particularly limited to those mentioned above and suitably selected according to the emission color, device performance and relation to the polymer each being desired.

The light-emitting layer may contain an arylamine compound and/or a styrylamine compound in an amount of 0.1 to 50 parts by weight based on 100 parts by weight of the polymer, because the luminance and the emission efficiency are further improved. Examples of the arylamine compound are described in, for example, WO 02/20459, JP 2006-140235A, JP 2006-306745A, WO 2004/09211, WO 2004/044088, JP 2006-256979A, JP 2007-230960A, WO 2004/083162, JP 2006-298793A, WO 02/20460, WO 02/20460, JP 2007-137824A, JP 2007-45725A, and JP 2005-068087A. Examples of the styrylamine compound are described in, for example, WO 02/20459.

The light-emitting layer may contain the metal complex in an amount of 0.1 to 50 parts by weight based on 100 parts by weight of the polymer, because the luminance and the emission efficiency are further improved.

The hole injecting/transporting layer is a layer for facilitating the injection of holes into the light-emitting layer and transporting holes to the emission region and has a large hole mobility and an ionization potential generally as small as 55 eV or less. A material capable of transporting holes to the light-emitting layer even under a lower electric field strength, for example, a material having a hole mobility of at least $10^{-6}$ cm$^2$/Vs at an electric field strength of $10^4$ to $10^6$ V/cm is preferably used for forming the hole injecting/transporting layer. The material is arbitrarily selected from known hole transporting materials commonly used as photoconductive materials and known materials commonly used for the hole injecting layer of organic EL device. The hole injecting/transporting layer is formed by depositing a hole injecting/transporting material in a thin film, for example, by a vacuum vapor deposition method, a spin coating method, a casting method or LB method. The thickness of the hole injecting/transporting layer is generally 5 nm to 5 μm, although not particularly limited thereto.

The electron injecting/transporting layer is a layer for facilitating the injection of electrons into the light-emitting layer and transporting electrons to the emission region and has a large electron mobility. The adhesion improving layer is an electron injecting layer particularly made of a material having a good adhesion to the cathode. As the material for the electron injecting layer, a metal complex of 8-hydroxyquinoline or its derivative are suitably used. Examples of the metal complex of 8-hydroxyquinoline or its derivative include metal chelated oxinoid compound having a chelating ligand of oxine (generally referred to as 8-quinolinol or 8-hydroxyquinoline), for example, tris(8-quinolino)aluminum. Since the electric filed exerts its influence on the ultrathin films of the organic EL device of the invention, the pixel defect due to leakage and short circuit is likely to cause. To prevent this, an insulating thin-film layer may be disposed between a pair of electrodes.

Examples of the material for forming the insulating layer include aluminum oxide, lithium fluoride, lithium oxide, cesium fluoride, cesium oxide, magnesium oxide, magnesium fluoride, calcium oxide, calcium fluoride, aluminum nitride, titanium oxide, silicon oxide, germanium oxide, silicon nitride, boron nitride, molybdenum oxide, ruthenium oxide, and vanadium oxide. A mixture thereof is also usable. The insulating layer may be a laminate of layers of these materials.

As described above, the organic EL device of the invention is produced, for example, by forming the anode, the light-emitting layer, the optional hole injecting layer, the optional electron injecting layer, and finally the cathode by the method using the above materials each mentioned above. Alternatively, the organic EL device may be produced in the reverse order from the cathode to the anode.

EXAMPLES

The present invention is explained below in more detail with reference to the examples. However, it should be noted that the scope of the invention is not limited to the following examples.

Example 1

(1) Synthesis of Monomer

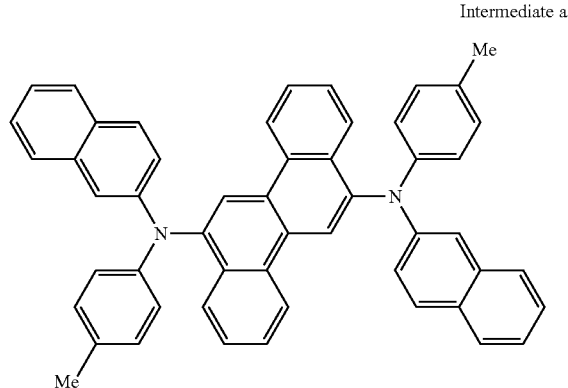

Intermediate a

-continued

Intermediate b

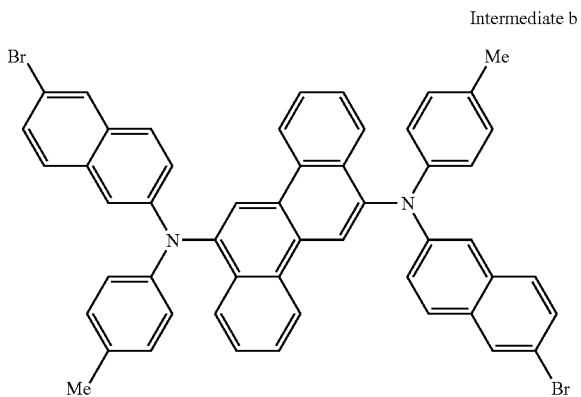

-continued

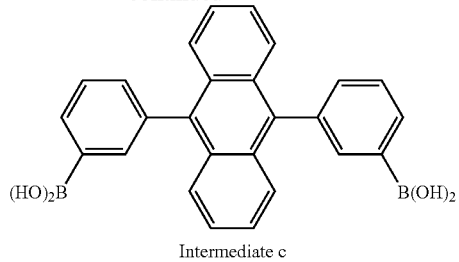

Intermediate c

Into a 300-ml three-necked flask equipped with a cooling column, 3.8 g (10 mmol) of 6,12-dibromochrysene, 5.83 g (25 mmol) of tolylnaphthylamine, 0.03 g (1.5 mol %) of palladium acetate, 0.06 g (3 mol %) of tri-t-butylphosphine, 2.4 g (25 mmol) of sodium t-butoxide, and 100 ml of dry toluene were charged in an argon atmosphere. The mixture was heat-dried over one night at 100° C. After the reaction, the precipitated crystals were collected by filtration and washed with 50 ml of toluene and then 100 ml of methanol, to obtain 5.9 g of pale yellow powder (Intermediate a, 85% yield).

Into a three-necked flask, 5.9 g (8.54 mmol) of Intermediate a and 150 ml of N,N'-dimethylformamide were charged in argon atmosphere. Then, a solution of 3.11 g (17.5 mmol) of N-bromosuccinimide in 10 ml of dry N,N'-dimethylformamide was added to the flask dropwise at 25 to 35° C. After the dropwise addition, the reaction liquid was refluxed under heating for 2 h to allow the reaction to proceed. Thereafter, the reaction mixture was allowed to stand for cooling to room temperature. When the temperature dropped to 25° C. or lower, 150 ml of methanol was added dropwise. The precipitated crystals were collected by filtration, washed with methanol and vacuum dried, to obtain 5.4 g (6.36 mmol, 78% yield, 99.5% purity by HPLC) of the aimed Intermediate b (Monomer 1).

Intermediate c (Monomer 4) was synthesized by a common method according to the following reaction scheme.

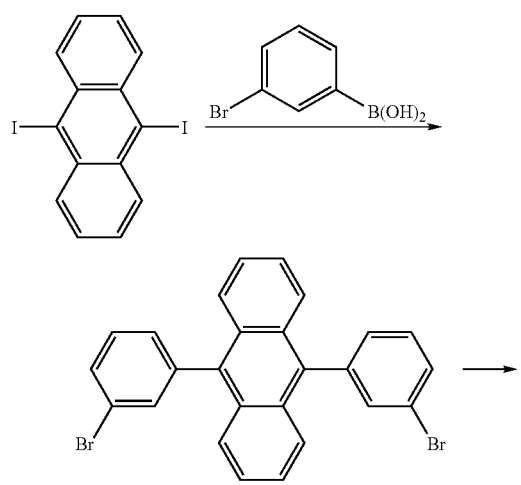

(2) Synthesis of Polymer

Into a 300-ml three-necked flask equipped with a cooling column, 0.203 g (0.24 mmol) of Intermediate b, 1.08 g (3.76 mmol) of 2,6-dibromonaphthalene (Monomer 2), 1.66 g (3.96 mmol) of Intermediate c, 2.7 mg of palladium acetate, 29.6 mg of tris(2-methoxyphenyl)phosphine, Aliquat 336 (0.52 g, manufactured by Aldrich Chemical Co., Inc.), and 40 ml of dry toluene were charged in argon atmosphere. The mixture was heated to 105° C. The resulting reaction liquid was added dropwise with a 2 M $Na_2CO_3$ aqueous solution (10.9 ml) and refluxed for 8 h. After the reaction, 50 mg of phenyl borate was added and the reflux was continued for 2 h to allow the reaction to proceed. After adding an aqueous solution of sodium diethyldithiacarbamate, the mixture was stirred at 80° C. for 2 h. After cooling, the mixture was extracted with an organic solvent and then the extract was concentrated. The precipitate was collected by filtration and successively washed with ion-exchanged water, a 3% aqueous solution of acetic acid, ion-exchanged water, and methanol. The obtained precipitate was dissolved in toluene under heating and purified by passing through a silica gel column. The obtained toluene solution was concentrated and then added dropwise to a methanol solution for reprecipitation. The precipitate was collected by filtration and dried to obtain Polymer 1 (1.98 g).

The molecular weights of Polymer 1 were Mn=110,000 and Mw=250,000 (standard polystyrene calibration).

On a glass substrate having a 150-nm thick ITO film sputtered, PEDOT/PSS aqueous solution (Bayton P available from Bayer Aktiengesellschaft) was spin-coated to form a film of 50 nm thick and dried at 200° C. for 10 min on a hot plate. Then, a 1.2 wt % xylene solution of Polymer 1 was spin-coated at 900 rpm to form a film of about 100 nm thick, dried at 130° C. for 1 h in argon atmosphere, and then vacuum dried. Thereafter, Alq was vapor-deposited to form an electron transporting layer of 20 nm thick, and lithium fluoride was vapor-deposited to a thickness of about 1 nm and then aluminum to a thickness of about 150 nm to form a cathode, thereby producing an organic EL device.

The device characteristics of the obtained device are collectively shown in Tables 3 and 4.

Example 2

(1) Synthesis of Monomer

In the same manner as in Example 1, Monomer 1 shown in Table 1 was synthesized.

(2) Synthesis of Polymer

Into a 300-ml three-necked flask equipped with a cooling column, 0.180 g (0.24 mmol) of Monomer 1, 0.938 g (3.28 mmol) of Monomer 2 (2,6-dibromonaphthalene), 0.113 g (0.48 mmol) of Monomer 3 (1,3-dibromobenzene), 1.66 g (3.96 mmol) of Monomer 4, 2.7 mg of palladium acetate, 29.6 mg of tris(2-methoxyphenyl)phosphine, Aliquat 336 (0.52 g, manufactured by Aldrich Chemical Co., Inc.), and 40 ml of dry toluene were charged. The mixture was heated to 105° C. The resulting reaction liquid was added dropwise with a 2 M Na$_2$CO$_3$ aqueous solution (10.9 ml) and refluxed for 8 h. After the reaction, 50 mg of phenyl borate was added and the reflux was further continued for 2 h to allow the reaction to proceed. After adding an aqueous solution of sodium diethyldithiacarbamate, the mixture was stirred at 80° C. for 2 h. After cooling, the mixture was extracted with an organic solvent and then the extract was concentrated. The precipitate was collected by filtration and successively washed with ion-exchanged water, a 3% aqueous solution of acetic acid, ion-exchanged water, and methanol. The obtained precipitate was dissolved in toluene under heating and purified by passing through a silica gel column. The obtained toluene solution was concentrated and then added dropwise to a methanol solution for reprecipitation. The precipitate was collected by filtration and dried to obtain Polymer 2 (1.88 g).

In the same manner as in Example 1, a device was produced. The results of the analysis of polymer and the evaluation of the device are collectively shown in Tables 3 and 4.

Examples 3-22 and Comparative Examples 1-2

In the same manner as in Example 1 or 2, Polymers 3-22 and the comparative compounds 1 and 2 were synthesized. The combination of monomers are shown in Tables 1 and 2, and the results of the analysis of synthesized polymers and the evaluation of devices are shown in Tables 3 and 4.

TABLE 1

Monomers of Polymer (blue emission)

| | Monomer 1 | Monomer 2 |
|---|---|---|
| Examples | | |
| 1 | 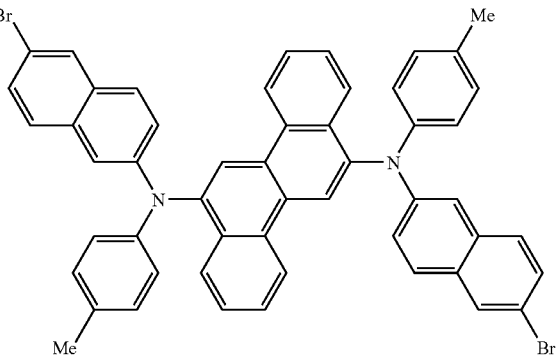 | 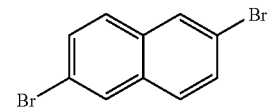 |
| 2 | 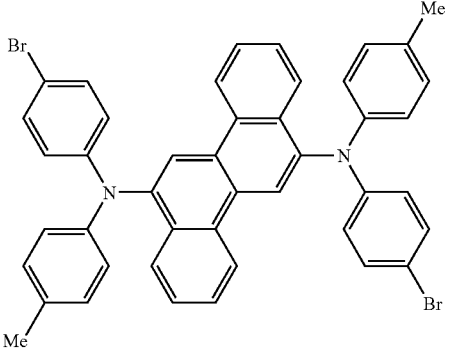 [SMILES: Cc1ccc(N(c2ccc(Br)cc2)c2cc3c4ccccc4c(N(c4ccc(C)cc4)c4ccc(Br)cc4)cc3c3ccccc23)cc1] | 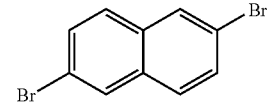 [SMILES: Brc1ccc2cc(Br)ccc2c1] |
| 3 | 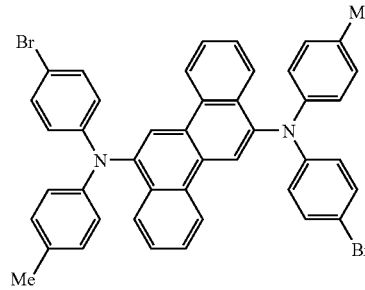 | 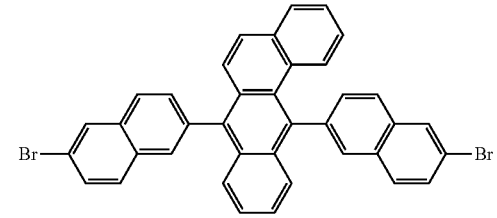 [SMILES: Brc1ccc2cc(-c3c4ccccc4c(-c4ccc5cc(Br)ccc5c4)c4c3ccc3ccccc34)ccc2c1] |

TABLE 1-continued
Monomers of Polymer (blue emission)
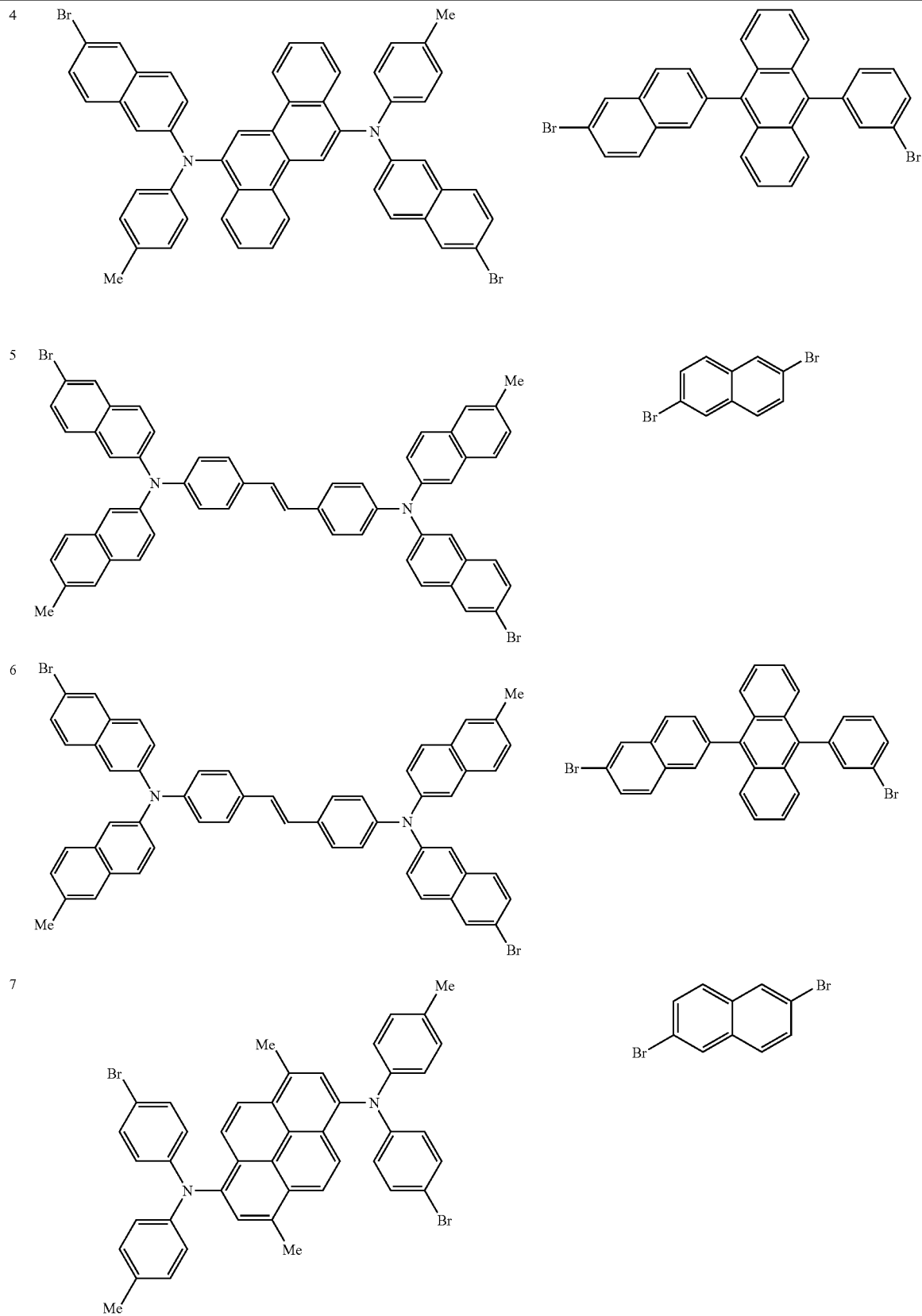

TABLE 1-continued
Monomers of Polymer (blue emission)
8 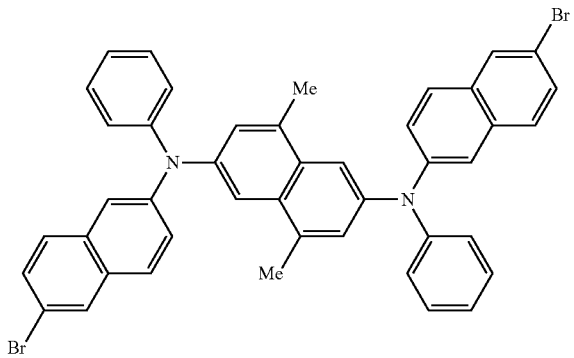 [SMILES: Cc1cc(N(c2ccccc2)c2ccc3cc(Br)ccc3c2)cc2c(C)cc(N(c3ccccc3)c3ccc4cc(Br)ccc4c3)cc12] 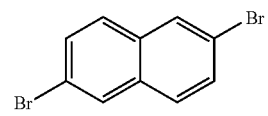 [SMILES: Brc1ccc2cc(Br)ccc2c1]
9 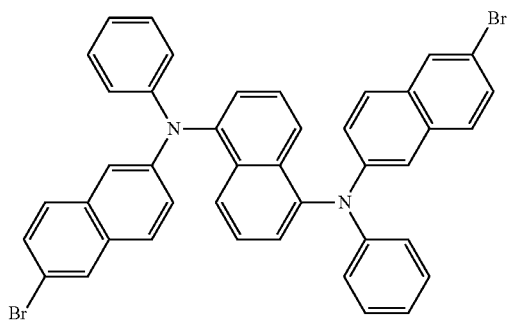 [SMILES: Brc1ccc2cc(N(c3ccccc3)c3cccc4c(N(c5ccccc5)c5ccc6cc(Br)ccc6c5)cccc34)ccc2c1] 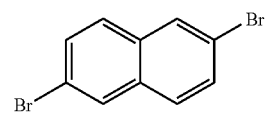
10 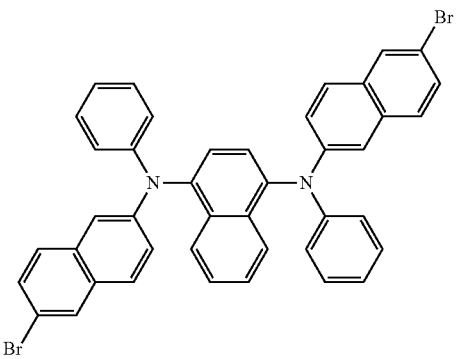 [SMILES: Brc1ccc2cc(N(c3ccccc3)c3ccc(N(c4ccccc4)c4ccc5cc(Br)ccc5c4)c4ccccc34)ccc2c1] 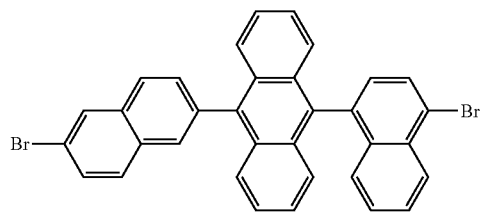 [SMILES: Brc1ccc2cc(-c3c4ccccc4c(-c4ccc(Br)c5ccccc45)c4ccccc34)ccc2c1]
11 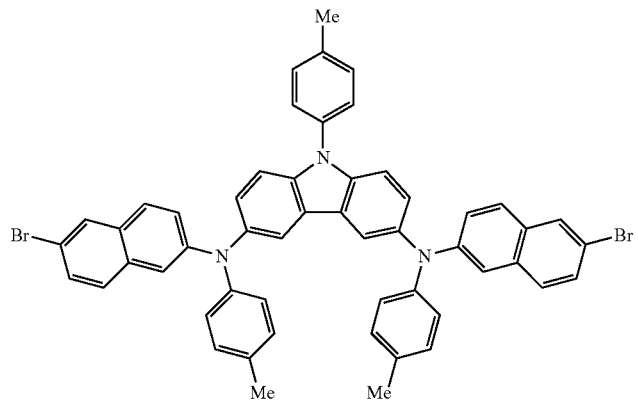 [SMILES: Cc1ccc(N(c2ccc3cc(Br)ccc3c2)c2ccc3c(c2)c2cc(N(c4ccc(C)cc4)c4ccc5cc(Br)ccc5c4)ccc2n3-c2ccc(C)cc2)cc1] 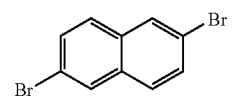

TABLE 1-continued

| Monomers of Polymer (blue emission) | |
|---|---|
| 12 [structure: 9,9-dimethylfluorene with two N(phenyl)(6-bromonaphthalen-2-yl) substituents at 2,7-positions] | [structure: 2,6-dibromonaphthalene] |
| 13 [structure: bis-naphthalene linked with two N(phenyl)(6-bromonaphthalen-2-yl) groups] | [structure: 2,6-dibromonaphthalene] |

| | Monomer 3 | Monomer 4 |
|---|---|---|
| | Examples | |
| 1 | — | [structure: 9,10-bis(3-boronic acid phenyl)anthracene] |
| 2 | [structure: 1,3-dibromobenzene] | [structure: 9,10-bis(3-boronic acid phenyl)phenanthrene] |
| 3 | — | [structure: 1,3-benzenediboronic acid] |
| 4 | [structure: 4,4'-dibromodiphenyl ether] | [structure: 1,3-benzenediboronic acid] |

TABLE 1-continued

Monomers of Polymer (blue emission)

| # | Monomer 1 | Monomer 2 |
|---|---|---|
| 5 | — | 9,10-bis(3-boronophenyl)anthracene |
| 6 | — | benzene-1,3-diboronic acid |
| 7 | 4,4'-dibromodiphenyl ether | 9,10-bis(3-boronophenyl)anthracene |
| 8 | 1,3-dibromobenzene | 9,10-bis(3-boronophenyl)anthracene |
| 9 | 1,3-dibromobenzene | 9,10-bis(3-boronophenyl)anthracene |
| 10 | — | benzene-1,3-diboronic acid |
| 11 | 4,4'-dibromodiphenyl ether | 9,10-bis(3-boronophenyl)anthracene |

TABLE 1-continued

Monomers of Polymer (blue emission)

| | | |
|---|---|---|
| 23 | — | 9,10-bis(3-boronophenyl)anthracene |
| 13 | 3,3'-dibromobiphenyl | 9,10-bis(3-boronophenyl)anthracene (with additional fused ring) |

TABLE 2

Monomers of Polymer (green emission and comparisons)

| | Monomer 1 | Monomer 2 |
|---|---|---|

Examples

| | | |
|---|---|---|
| 14 | N,N'-bis(6-bromonaphthalen-2-yl)-N,N'-di-p-tolyl-anthracene-9,10-diamine | 2,6-dibromonaphthalene |
| 15 | N,N'-bis(6-bromonaphthalen-2-yl)-N,N'-di-p-tolyl-anthracene-9,10-diamine | 1,6-dibromopyrene |

TABLE 2-continued
Monomers of Polymer (green emission and comparisons)
16 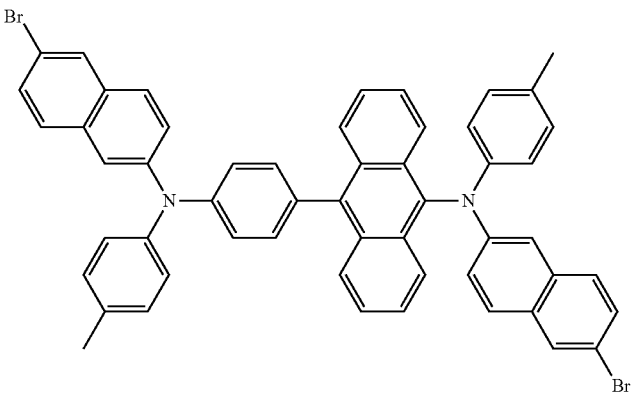 [SMILES: Cc1ccc(N(c2ccc(-c3c4ccccc4c(N(c4ccc(C)cc4)c4ccc5cc(Br)ccc5c4)c4ccccc34)cc2)c2ccc3cc(Br)ccc3c2)cc1] 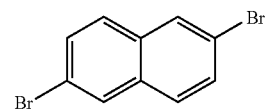
17 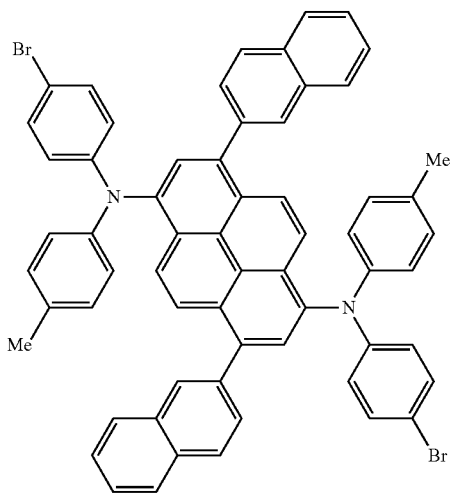 [SMILES: Cc1ccc(N(c2ccc(Br)cc2)c2cc(-c3ccc4ccccc4c3)c3ccc4c(N(c5ccc(C)cc5)c5ccc(Br)cc5)cc(-c5ccc6ccccc6c5)c5ccc2c3c54)cc1] 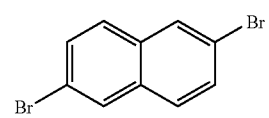
18 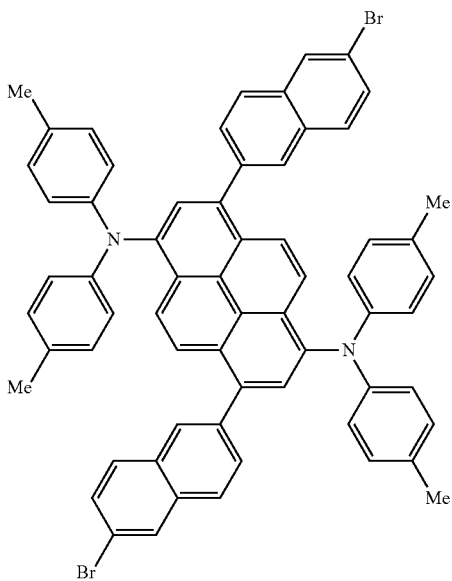 [SMILES: Cc1ccc(N(c2ccc(C)cc2)c2cc(-c3ccc4cc(Br)ccc4c3)c3ccc4c(N(c5ccc(C)cc5)c5ccc(C)cc5)cc(-c5ccc6cc(Br)ccc6c5)c5ccc2c3c54)cc1] 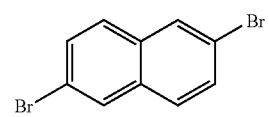

US 8,558,221 B2
37                                                                                      38
TABLE 2-continued
Monomers of Polymer (green emission and comparisons)
19 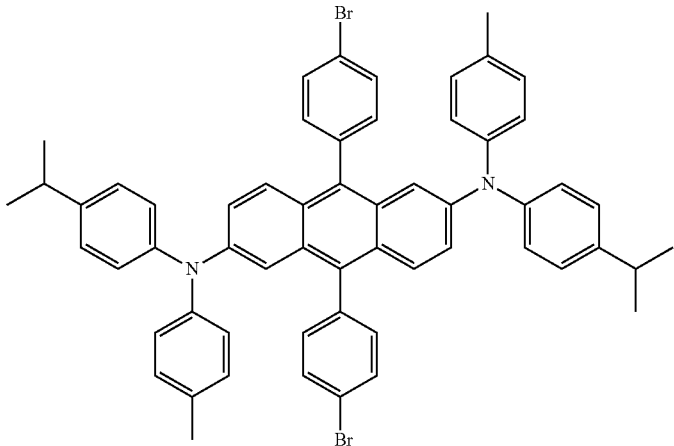 [SMILES: Cc1ccc(N(c2ccc(C(C)C)cc2)c2ccc3c(-c4ccc(Br)cc4)c4cc(N(c5ccc(C)cc5)c5ccc(C(C)C)cc5)ccc4c(-c4ccc(Br)cc4)c3c2)cc1] 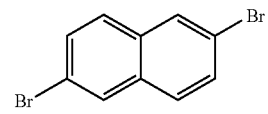
20 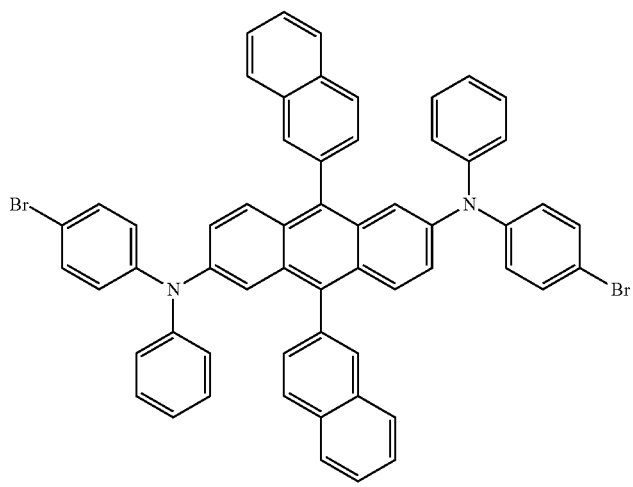 [SMILES: Brc1ccc(N(c2ccccc2)c2ccc3c(-c4ccc5ccccc5c4)c4cc(N(c5ccccc5)c5ccc(Br)cc5)ccc4c(-c4ccc5ccccc5c4)c3c2)cc1] 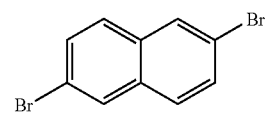
21 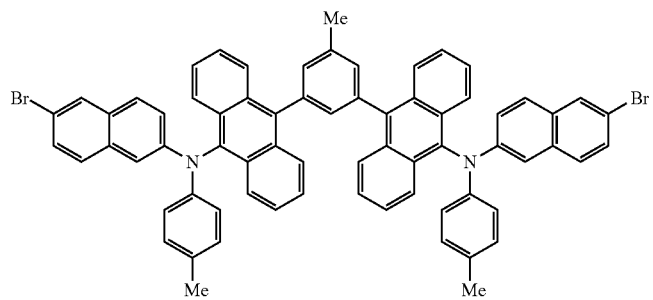 [SMILES: Cc1ccc(N(c2ccc3cc(Br)ccc3c2)c2c3ccccc3c(-c3cc(C)cc(-c4c5ccccc5c(N(c5ccc(C)cc5)c5ccc6cc(Br)ccc6c5)c5ccccc45)c3)c3ccccc23)cc1] 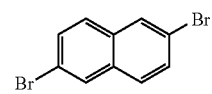

TABLE 2-continued
Monomers of Polymer (green emission and comparisons)
22 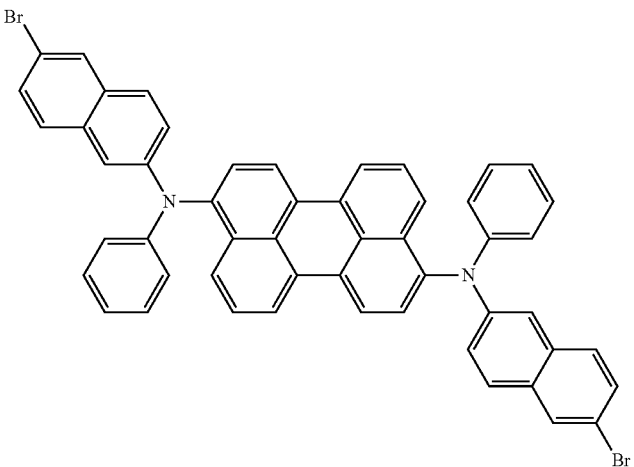 [SMILES: Brc1ccc2cc(N(c3ccccc3)c3ccc4c5cccc6c(N(c7ccccc7)c7ccc8cc(Br)ccc8c7)ccc(c7cccc3c74)c65)ccc2c1] 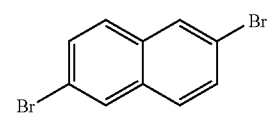
23 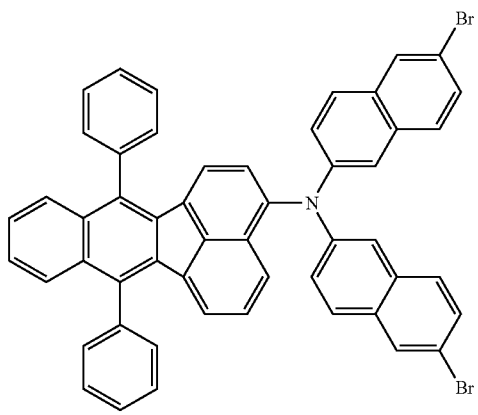 [SMILES: Brc1ccc2cc(N(c3ccc4cc(Br)ccc4c3)c3ccc4c5c(cccc35)-c3c-4c(-c4ccccc4)c4ccccc4c3-c3ccccc3)ccc2c1] 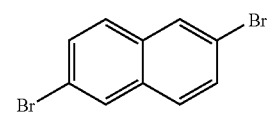
Comparative Examples
1 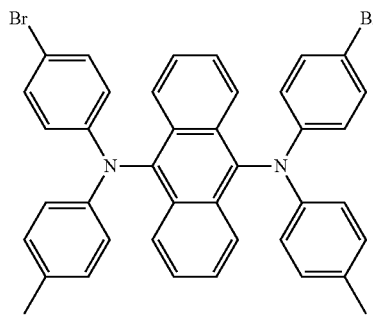 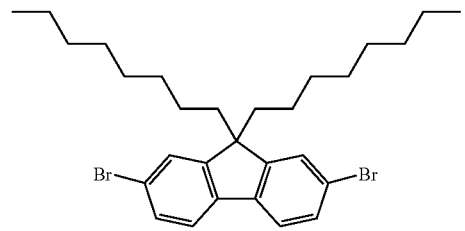 [SMILES: CCCCCCCCC1(CCCCCCCC)c2cc(Br)ccc2-c2ccc(Br)cc21]

TABLE 2-continued
Monomers of Polymer (green emission and comparisons)
| | Monomer 3 | Monomer 4 |
|---|---|---|
| 2 | 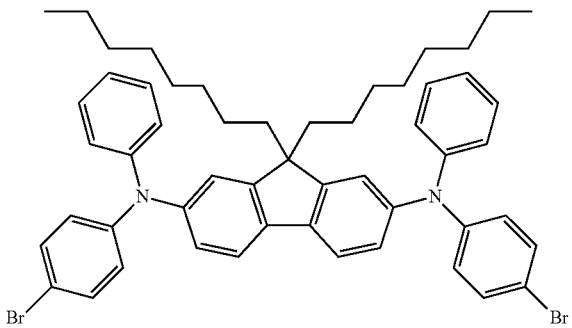 [SMILES: CCCCCCCCC1(CCCCCCCC)c2cc(N(c3ccccc3)c3ccc(Br)cc3)ccc2-c2ccc(N(c3ccccc3)c3ccc(Br)cc3)cc21] | 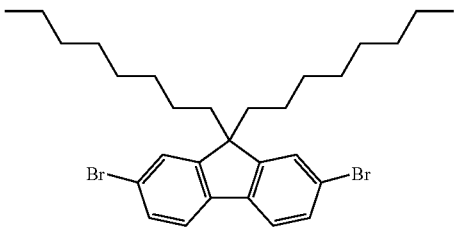 [SMILES: CCCCCCCCC1(CCCCCCCC)c2cc(Br)ccc2-c2ccc(Br)cc21] |
Examples
| | Monomer 3 | Monomer 4 |
|---|---|---|
| 14 | — | 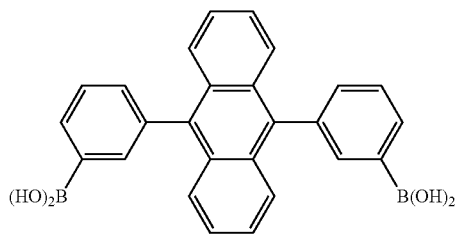 [SMILES: OB(O)c1cccc(-c2c3ccccc3c(-c3cccc(B(O)O)c3)c3ccccc23)c1] |
| 15 | — | 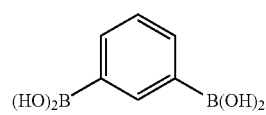 |
| 16 | 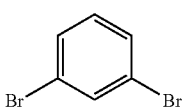 | 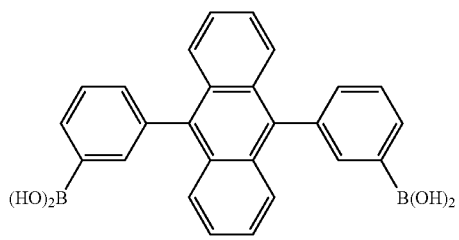 [SMILES: OB(O)c1cccc(-c2c3ccccc3c(-c3cccc(B(O)O)c3)c3ccccc23)c1] |
| 17 | — | 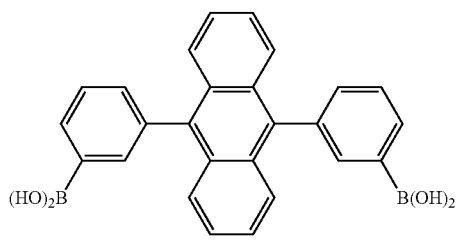 [SMILES: OB(O)c1cccc(-c2c3ccccc3c(-c3cccc(B(O)O)c3)c3ccccc23)c1] |
| 18 | 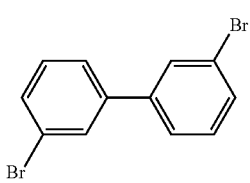 | 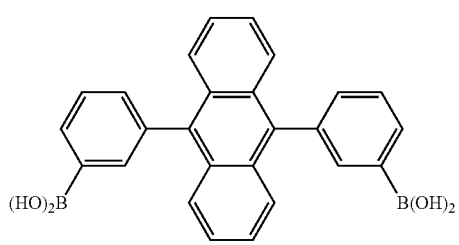 [SMILES: OB(O)c1cccc(-c2c3ccccc3c(-c3cccc(B(O)O)c3)c3ccccc23)c1] |

TABLE 2-continued
| Monomers of Polymer (green emission and comparisons) |
| 19 | — | 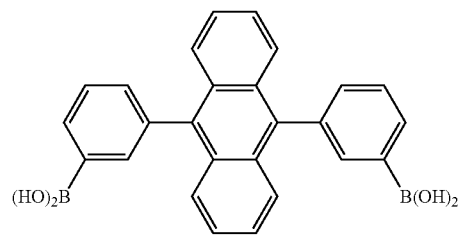 [SMILES: OB(O)c1cccc(-c2c3ccccc3c(-c3cccc(B(O)O)c3)c3ccccc23)c1] |
| 20 | — | 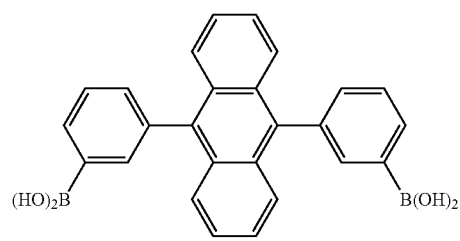 [SMILES: OB(O)c1cccc(-c2c3ccccc3c(-c3cccc(B(O)O)c3)c3ccccc23)c1] |
| 21 | — | 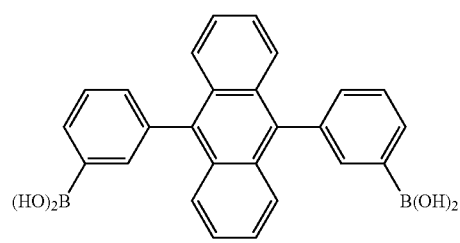 [SMILES: OB(O)c1cccc(-c2c3ccccc3c(-c3cccc(B(O)O)c3)c3ccccc23)c1] |
| 22 | — | 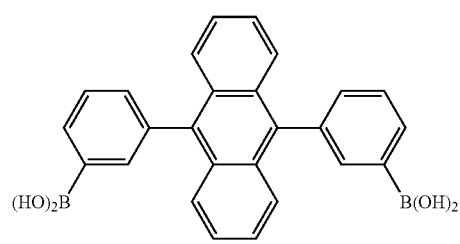 [SMILES: OB(O)c1cccc(-c2c3ccccc3c(-c3cccc(B(O)O)c3)c3ccccc23)c1] |
| 23 | — | 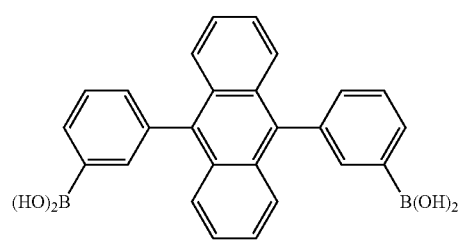 [SMILES: OB(O)c1cccc(-c2c3ccccc3c(-c3cccc(B(O)O)c3)c3ccccc23)c1] |
Comparative Examples
| 1 | — | 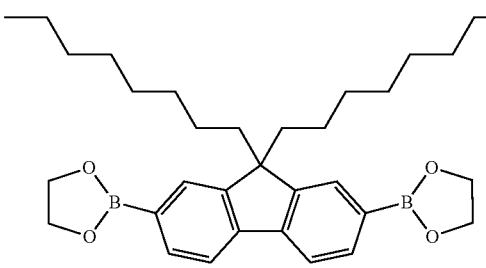 |

TABLE 2-continued

Monomers of Polymer (green emission and comparisons)

| | | |
|---|---|---|
| 2 | — | 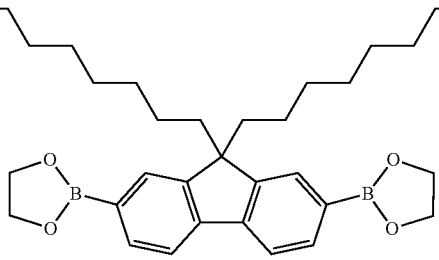 |

TABLE 3

(blue emission)

| Examples | Mn | Mw | Emission color | Peak wavelength (nm) | Maximum efficiency (cd/A) | Half lifetime (@ 1000 nit) |
|---|---|---|---|---|---|---|
| 1 | 45,000 | 103,500 | blue | 450 | 4.2 | 135 |
| 2 | 57,000 | 125,400 | blue | 445 | 3.9 | 120 |
| 3 | 50,000 | 115,000 | blue | 445 | 3.5 | 100 |
| 4 | 60,000 | 144,000 | blue | 450 | 4 | 130 |
| 5 | 49,000 | 117,600 | blue | 445 | 3.6 | 105 |
| 6 | 51,000 | 117,300 | blue | 445 | 3.4 | 110 |
| 7 | 54,000 | 129,600 | blue | 450 | 3.8 | 105 |
| 8 | 61,000 | 140,300 | blue | 435 | 3.1 | 85 |
| 9 | 62,000 | 142,600 | blue | 430 | 2.9 | 80 |
| 10 | 59,000 | 141,600 | blue | 430 | 2.9 | 80 |
| 11 | 53,000 | 121,900 | blue | 430 | 3.1 | 75 |
| 12 | 49,000 | 112,700 | blue | 430 | 3.3 | 85 |
| 13 | 48,000 | 110,400 | blue | 435 | 2.9 | 70 |

TABLE 4

(green emission and comparisons)

| | Mn | Mw | Emission color | Peak wavelength (nm) | Maximum efficiency (cd/A) | Half lifetime (@ 1000 nit) |
|---|---|---|---|---|---|---|
| Examples | | | | | | |
| 14 | 75,000 | 187,500 | green | 535 | 12.5 | 450 |
| 15 | 66,000 | 158,400 | green | 535 | 13.1 | 350 |
| 16 | 69,000 | 165,600 | green | 540 | 12.7 | 370 |
| 17 | 53,000 | 132,500 | green | 530 | 13.5 | 430 |
| 18 | 64,000 | 160,000 | green | 530 | 13.3 | 390 |
| 19 | 72,000 | 172,800 | green | 535 | 12.1 | 300 |
| 20 | 59,000 | 141,600 | green | 530 | 12.2 | 310 |
| 21 | 51,000 | 122,400 | green | 535 | 12.1 | 300 |
| 22 | 54,000 | 135,000 | green | 535 | 11.5 | 270 |
| 23 | 62,000 | 148,800 | green | 535 | 11.9 | 250 |
| Comparative Examples | | | | | | |
| 1 | 110,000 | 330,000 | green | 530 | 9.7 | 180 |
| 2 | 28,000 | 52,000 | blue | 460 | 3 | 5 |

INDUSTRIAL APPLICABILITY

The polymer of the invention is useful as the light emission material and provides an organic EL device excellent in the performance such as lifetime and emission efficiency.

What is claimed is:

1. A polymer comprising a repeating unit A and a repeating unit B, wherein the repeating unit A is selected from divalent groups which are derived from compounds represented by formula (1):

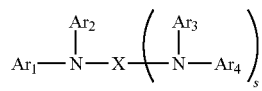
(1)

wherein $Ar_1$ to $Ar_4$ are each independently a substituted or unsubstituted aryl group having 6 to 40 ring-forming carbon atoms, a substituted or unsubstituted heterocyclic group having 3 to 40 ring-forming atoms, or a substituted or unsubstituted alkyl group having 1 to 50 carbon atoms;

X is a substituted or unsubstituted aryl group having 6 to 40 ring-forming carbon atoms, a substituted or unsubstituted heterocyclic group having 3 to 40 ring-forming atoms, or a substituted or unsubstituted styrene-derived group;

s is an integer of 0 to 3; and two or three —$NAr_3Ar_4$ groups may be the same or different when s is 2 or 3; and —$NAr_3Ar_4$ is a hydrogen atom when s is 0; and the repeating unit B is selected from divalent groups which are derived from compounds represented by any one of formulae (2) to (6):

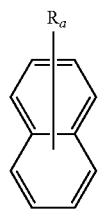
(2)

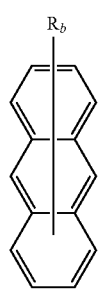
(3)

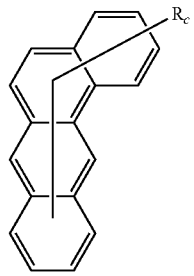
(4)

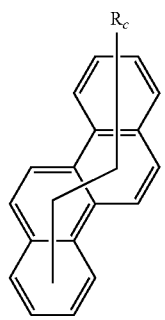
(5)

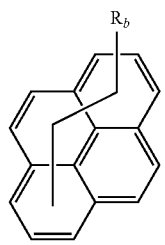
(6)

wherein R is a substituted or unsubstituted aryl group having 6 to 40 ring-forming carbon atoms, a substituted or unsubstituted heterocyclic group having 3 to 40 ring-forming atoms, or a substituted or unsubstituted alkyl group having 1 to 50 carbon atoms;

a is an integer of 0 to 6;

b is an integer of 0 to 8; and c is an integer of 0 to 10.

2. The polymer of claim 1, wherein the repeating unit B is a divalent group which is derived from compound represented by formula (3), and the compound represented by formula (3) is

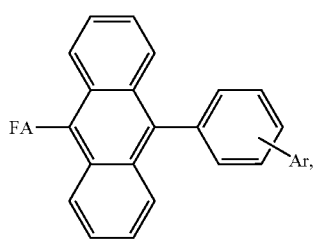

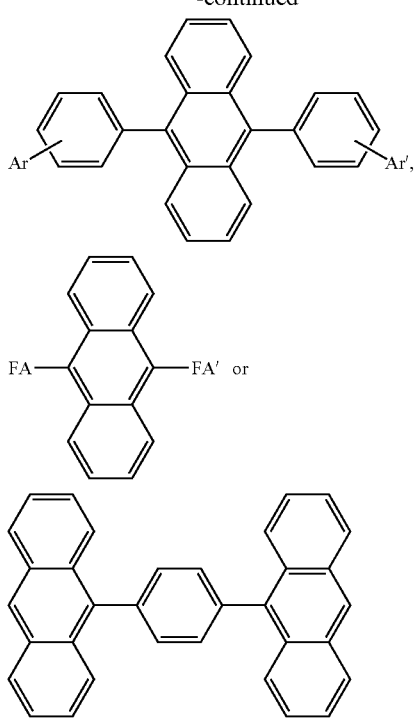

wherein FA and FA' are each independently a substituted or unsubstituted aryl group having 6 to 30 ring-forming carbon atoms, and Ar and Ar' are each independently a substituted or unsubstituted aryl group having 6 to 40 ring-forming carbon atoms, a substituted or unsubstituted heterocyclic group having 3 to 40 ring-forming atoms, or a substituted or unsubstituted alkyl group having 1 to 50 carbon atoms.

3. The polymer of claim 1, wherein the compounds represented by formula (1) are represented by any one of formulae (X1) to (X11):

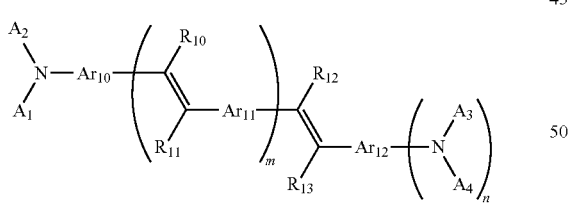

wherein $Ar_{10}$ and $Ar_{11}$ are each independently a substituted or unsubstituted arylene group having 6 to 40 ring-forming carbon atoms or a substituted or unsubstituted divalent heterocyclic group having 3 to 40 ring-forming carbon atoms; $Ar_{12}$ is a substituted or unsubstituted aryl group having 6 to 40 ring-forming carbon atoms or a substituted or unsubstituted heterocyclic group having 3 to 40 ring-forming carbon atoms;

$R_{10}$ to $R_{13}$ are each independently a hydrogen atom, a substituted or unsubstituted alkyl group having 1 to 50 carbon atoms, a substituted or unsubstituted aryl group having 6 to 40 ring-forming carbon atoms, a substituted or unsubstituted aralkyl group having 7 to 50 carbon atoms, a substituted or unsubstituted cycloalkyl group having 3 to 50 ring-forming carbon atoms, a substituted or unsubstituted alkoxy group having 1 to 50 carbon atoms, a substituted or unsubstituted aryloxy group having 6 to 40 ring-forming carbon atoms, an amino group, a mono- or diarylamino group having a substituted or unsubstituted aryl group which has 6 to 40 ring-forming carbon atoms, a mono- or dialkylamino group having a substituted or unsubstituted alkyl group which has 1 to 20 carbon atoms, a cyano group, a nitro group, a hydroxyl group, or a halogen atom;

$A_1$ to $A_4$ are each independently a substituted or unsubstituted alkyl group having 1 to 50 carbon atoms or a substituted or unsubstituted aryl group having 6 to 40 ring-15 forming carbon atoms;

m is an integer of 0 to 2; and n is an integer of 1 to 3;

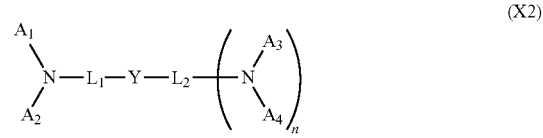

wherein $A_1$, $A_2$, $A_3$, $A_4$, and n are as defined above, $L_1$ and $L_2$ are each independently a single bond or a substituted or unsubstituted arylene group having 6 to 20 ring-forming carbon atoms, and Y is a non-condensed aryl group having 1 to 4 benzene rings;

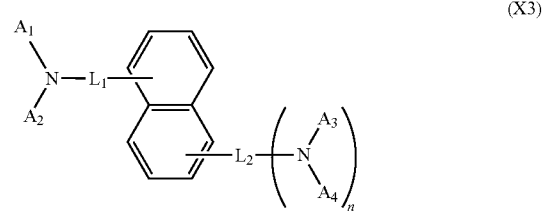

wherein $A_1$, $A_2$, $A_3$, $A_4$, $L_1$, $L_2$, and n are as defined above;

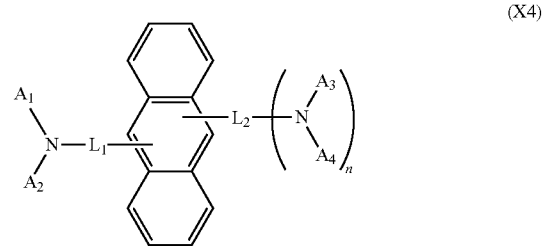

wherein $A_1, A_2, A_3, A_4, L_1, L_2,$ and n are as defined above;

(X5)

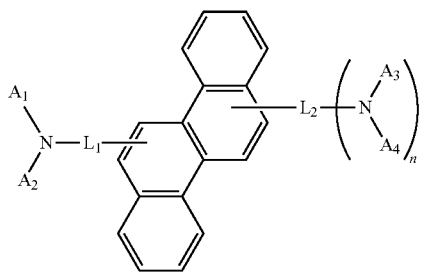

wherein $A_1, A_2, A_3, A_4, L_1, L_2,$ and n are as defined above;

(X6)

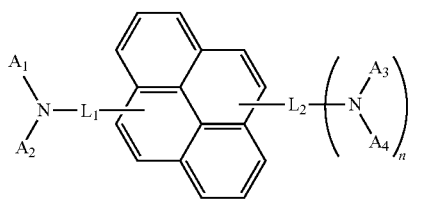

wherein $A_1, A_2, A_3, A_4, L_1, L_2,$ and n are as defined above;

(X7)

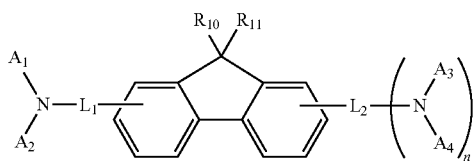

wherein $R_{10}, R_{11}, A_1, A_2, A_3, A_4, L_1, L_2,$ and n are as defined above;

(X8)

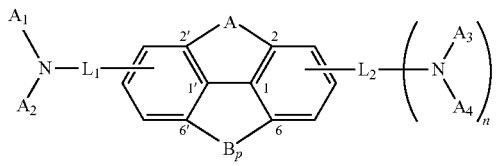

wherein $A_1, A_2, A_3, A_4, L_1, L_2,$ and n are as defined above;

A is a substituted or unsubstituted divalent saturated group which forms a 5- to 8-membered ring together with the carbon atoms at 1, 2, 1', and 2' positions of the biphenyl structure;

B is a substituted or unsubstituted divalent saturated group which forms a 5- to 8-membered ring together with the carbon atoms at 1, 6, 1', and 6' positions of the biphenyl structure and B may be the same as or different from A;

p is 0 or 1 and no bond is formed between the carbon atoms at 6 and 6' positions when p is 0; and the ring structure formed by A and the carbon atoms at 1, 2, 1', and 2' positions and/or the ring structure formed by B and the carbon atoms at 1, 6, 1', and 6' positions may have a spiro-ring structure;

(X9)

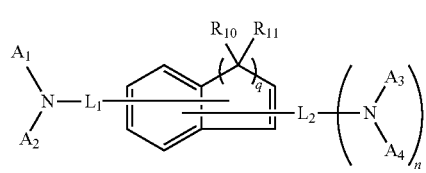

wherein $R_{10}, R_{11}, A_1, A_2, A_3, A_4, L_1, L_2,$ and n are as defined above and q is an integer of 1 to 3;

(X10)

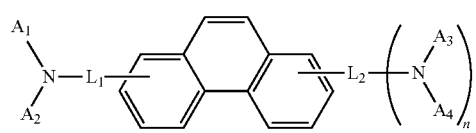

wherein $A_1, A_2, A_3, A_4, L_1, L_2$ and n are as defined above; and (X11)

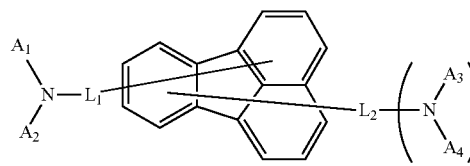

wherein $A_1, A_2, A_3, A_4, L_1, L_2,$ and n are as defined above.

4. The polymer of claim 1, wherein a molar ratio of the repeating units A and the repeating units B is 0.1:99.9 to 99.9:0.1.

5. An organic electroluminescent material comprising the polymer of claim 1.

6. The organic electroluminescent material of claim 5, which further comprises at least one compound different from said polymer comprising a repeating unit A and a repeating unit B, wherein the compound is selected from the group consisting of a compound represented by formula (1), a homopolymer comprising the repeating units A, a copolymer comprising the repeating units A, a compound represented by any one of formula (2) to (6), a homopolymer comprising the repeating units B, and a copolymer comprising the repeating units B:

wherein the formula (1) is:

(1)

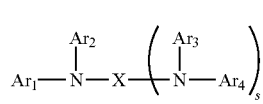

wherein $Ar_1$ to $Ar_4$ are each independently a substituted or unsubstituted aryl group having 6 to 40 ring-forming carbon atoms, a substituted or unsubstituted heterocyclic group having 3 to 40 ring-forming atoms, or a substituted or unsubstituted alkyl group having 1 to 50 carbon atoms;

X is a substituted or unsubstituted aryl group having 6 to 40 ring-forming carbon atoms, a substituted or unsubstituted heterocyclic group having 3 to 40 ring-forming atoms, or a substituted or unsubstituted styrene-derived group;

s is an integer of 0 to 3; and two or three —NAr$_3$Ar$_4$ groups may be the same or different when s is 2 or 3; and —NAr$_3$Ar$_4$ is a hydrogen atom when s is 0;

the repeating unit A is selected from divalent groups which are derived from compounds represented by formula (1);

the formulae (2) to (6) are:

(2)

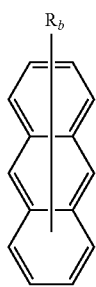
(3)

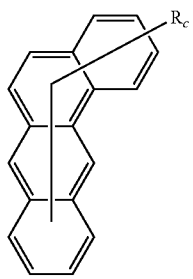
(4)

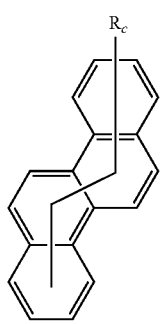
(5)

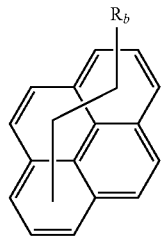
(6)

wherein R is a substituted or unsubstituted aryl group having 6 to 40 ring-forming carbon atoms, a substituted or unsubstituted heterocyclic group having 3 to 40 ring-forming atoms, or a substituted or unsubstituted alkyl group having 1 to 50 carbon atoms;

a is an integer of 0 to 6;

b is an integer of 0 to 8; and c is an integer of 0 to 10;

the repeating unit B is selected from divalent groups which are derived from compounds represented by any one of formulae (2) to (6).

7. An organic electroluminescence device comprising an anode, a cathode, and an organic compound layer which is disposed between the anode and the cathode, wherein the organic compound layer comprises a light-emitting layer comprising the polymer of claim 1.

8. The organic electroluminescence device of claim 7, wherein the light-emitting layer further comprises at least one compound different from said polymer comprising a repeating unit A and a repeating unit B, wherein the compound is selected from the group consisting of a compound represented by formula (1), a homopolymer comprising the repeating units A, a copolymer comprising the repeating units A, a compound represented by any one of formula (2) to (6), a homopolymer comprising the repeating units B, and a copolymer comprising the repeating units B:

wherein the formula (1) is:

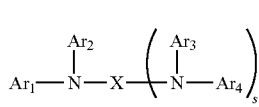
(1)

wherein Ar$_1$ to Ar$_4$ are each independently a substituted or unsubstituted aryl group having 6 to 40 ring-forming carbon atoms, a substituted or unsubstituted heterocyclic group having 3 to 40 ring-forming atoms, or a substituted or unsubstituted alkyl group having 1 to 50 carbon atoms;

X is a substituted or unsubstituted aryl group having 6 to 40 ring-forming carbon atoms, a substituted or unsubstituted heterocyclic group having 3 to 40 ring-forming atoms, or a substituted or unsubstituted styrene-derived group;

s is an integer of 0 to 3; and two or three —NAr$_3$Ar$_4$ groups may be the same or different when s is 2 or 3; and —NAr$_3$Ar$_4$ is a hydrogen atom when s is 0;

the repeating unit A is selected from divalent groups which are derived from compounds represented by formula (1);

the formulae (2) to (6) are:

(2)

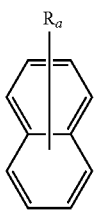

(3)

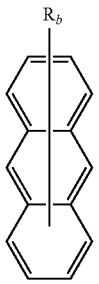

(4)

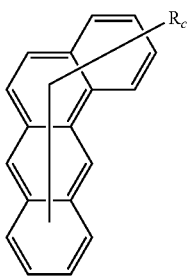

(5)

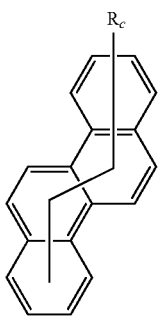

(6)

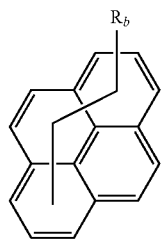

wherein R is a substituted or unsubstituted aryl group having 6 to 40 ring-forming carbon atoms, a substituted or unsubstituted heterocyclic group having 3 to 40 ring-forming atoms, or a substituted or unsubstituted alkyl group having 1 to 50 carbon atoms;
a is an integer of 0 to 6;
b is an integer of 0 to 8; and
c is an integer of 0 to 10;
the repeating unit B is selected from divalent groups which are derived from compounds represented by any one of formulae (2) to (6).

9. The organic electroluminescence device of claim 7, wherein the light-emitting layer further comprises at least one selected from the group consisting of a phosphorescent dopant and a fluorescent dopant.

10. The organic electroluminescence device of claim 7, wherein the light-emitting layer further comprises at least one selected from the group consisting of an arylamine compound and a styrylamine compound.

11. The organic electroluminescence device of claim 7, wherein the light-emitting layer further comprises a metal complex.

12. The polymer of claim 3, wherein the compounds represented by formula (1) are represented by formula (X1).

13. The polymer of claim 3, wherein the compounds represented by formula (1) are represented by formula (X2).

14. The polymer of claim 3, wherein the compounds represented by formula (1) are represented by formula (X3).

15. The polymer of claim 3, wherein the compounds represented by formula (1) are represented by formula (X4).

16. The polymer of claim 3, wherein the compounds represented by formula (1) are represented by formula (X5).

17. The polymer of claim 3, wherein the compounds represented by formula (1) are represented by formula (X6).

18. The polymer of claim 3, wherein the compounds represented by formula (1) are represented by formula (X7).

19. The polymer of claim 3, wherein the compounds represented by formula (1) are represented by formula (X8).

20. The polymer of claim 3, wherein the compounds represented by formula (1) are represented by formula (X9).

* * * * *